United States Patent
Mahler et al.

(10) Patent No.: US 10,461,056 B2
(45) Date of Patent: Oct. 29, 2019

(54) CHIP PACKAGE AND METHOD OF FORMING A CHIP PACKAGE WITH A METAL CONTACT STRUCTURE AND PROTECTIVE LAYER, AND METHOD OF FORMING AN ELECTRICAL CONTACT

(71) Applicant: Infineon Technologies AG, Neubiberg (DE)

(72) Inventors: Joachim Mahler, Regensburg (DE); Michael Bauer, Nittendorf (DE); Jochen Dangelmaier, Beratzhausen (DE); Reimund Engl, Munich (DE); Johann Gatterbauer, Parsberg (DE); Frank Hille, Munich (DE); Michael Huettinger, Munich (DE); Werner Kanert, Holzkirchen (DE); Heinrich Koerner, Bruckmuehl (DE); Brigitte Ruehle, Holzkirchen (DE); Francisco Javier Santos Rodriguez, Villach (AT); Antonio Vellei, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/600,857

(22) Filed: May 22, 2017

(65) Prior Publication Data
US 2017/0338169 A1    Nov. 23, 2017

(30) Foreign Application Priority Data

May 20, 2016  (DE) .................. 10 2016 109 349

(51) Int. Cl.
*H01L 23/00*    (2006.01)
*H01L 23/31*    (2006.01)
(Continued)

(52) U.S. Cl.
CPC .......... *H01L 24/48* (2013.01); *H01L 21/0217* (2013.01); *H01L 21/02164* (2013.01);
(Continued)

(58) Field of Classification Search
CPC .......... H01L 23/49541; H01L 21/0217; H01L 24/73; H01L 24/85; H01L 21/02164;
(Continued)

(56) References Cited

U.S. PATENT DOCUMENTS 4,001,872 A * 1/1977 Khajezadeh ............ H01L 21/56
257/635
4,780,780 A * 10/1988 Tanaka ................ G11B 5/2651
29/603.2

(Continued)

FOREIGN PATENT DOCUMENTS

CN      1039504 A    2/1990
CN    101388375 A    3/2009
(Continued)

OTHER PUBLICATIONS

Bae et al.,"Comprehensive Intermetallic Compound Phase Analysis and its Thermal Evolution at Cu Wirebond Interface"; IEEE Electronic Components and Technology Conference, 2014, pp. 1562-1570.
(Continued)

*Primary Examiner* — Alexander O Williams
(74) *Attorney, Agent, or Firm* — Viering, Jentschura & Partner MBB

(57) ABSTRACT

In various embodiments, a chip package is provided. The chip package may include a chip, a metal contact structure including a non-noble metal and electrically contacting the chip, a packaging material, and a protective layer including or essentially consisting of a portion formed at an interface between a portion of the metal contact structure and the
(Continued)

packaging material, wherein the protective layer may include a noble metal, wherein the portion of the protective layer may include a plurality of regions free from the noble metal, and wherein the regions free from the noble metal may provide an interface between the packaging material and the non-noble metal of the metal contact structure.

7 Claims, 17 Drawing Sheets

(51) Int. Cl.
    *H01L 23/29*     (2006.01)
    *H01L 21/02*     (2006.01)
    *H01L 23/495*     (2006.01)

(52) U.S. Cl.
    CPC ...... *H01L 21/02288* (2013.01); *H01L 23/293* (2013.01); *H01L 23/3135* (2013.01); *H01L 23/3142* (2013.01); *H01L 23/4952* (2013.01); *H01L 23/49582* (2013.01); *H01L 24/03* (2013.01); *H01L 24/05* (2013.01); *H01L 24/45* (2013.01); *H01L 24/83* (2013.01); *H01L 24/85* (2013.01); *H01L 21/0228* (2013.01); *H01L 21/02266* (2013.01); *H01L 21/02271* (2013.01); *H01L 21/02274* (2013.01); *H01L 23/3107* (2013.01); *H01L 24/29* (2013.01); *H01L 24/32* (2013.01); *H01L 24/73* (2013.01); *H01L 2224/0346* (2013.01); *H01L 2224/03826* (2013.01); *H01L 2224/03827* (2013.01); *H01L 2224/03831* (2013.01); *H01L 2224/04042* (2013.01); *H01L 2224/05073* (2013.01); *H01L 2224/05139* (2013.01); *H01L 2224/05147* (2013.01); *H01L 2224/05624* (2013.01); *H01L 2224/05639* (2013.01); *H01L 2224/05644* (2013.01); *H01L 2224/05647* (2013.01); *H01L 2224/05655* (2013.01); *H01L 2224/05657* (2013.01); *H01L 2224/05664* (2013.01); *H01L 2224/05666* (2013.01); *H01L 2224/05681* (2013.01); *H01L 2224/05684* (2013.01); *H01L 2224/2919* (2013.01); *H01L 2224/32245* (2013.01); *H01L 2224/4567* (2013.01); *H01L 2224/4568* (2013.01); *H01L 2224/4569* (2013.01); *H01L 2224/45139* (2013.01); *H01L 2224/45144* (2013.01); *H01L 2224/45147* (2013.01); *H01L 2224/45565* (2013.01); *H01L 2224/45572* (2013.01); *H01L 2224/45573* (2013.01); *H01L 2224/45611* (2013.01); *H01L 2224/45618* (2013.01); *H01L 2224/45639* (2013.01); *H01L 2224/45644* (2013.01); *H01L 2224/45649* (2013.01); *H01L 2224/45655* (2013.01); *H01L 2224/45657* (2013.01); *H01L 2224/45664* (2013.01); *H01L 2224/45666* (2013.01); *H01L 2224/45671* (2013.01); *H01L 2224/45672* (2013.01); *H01L 2224/45686* (2013.01); *H01L 2224/45693* (2013.01); *H01L 2224/4813* (2013.01); *H01L 2224/4846* (2013.01); *H01L 2224/4847* (2013.01); *H01L 2224/48091* (2013.01); *H01L 2224/48106* (2013.01); *H01L 2224/48247* (2013.01); *H01L 2224/48463* (2013.01); *H01L 2224/48465* (2013.01); *H01L 2224/48507* (2013.01); *H01L 2224/73265* (2013.01); *H01L 2224/8592* (2013.01); *H01L 2224/85205* (2013.01); *H01L 2224/85375* (2013.01); *H01L 2224/85801* (2013.01); *H01L 2924/0132* (2013.01); *H01L 2924/10253* (2013.01); *H01L 2924/181* (2013.01)

(58) Field of Classification Search
    CPC ... H01L 23/293; H01L 23/3135; H01L 24/05; H01L 24/32; H01L 21/02288; H01L 21/0228; H01L 21/02274; H01L 21/02271; H01L 21/02266; H01L 24/03; H01L 24/83; H01L 24/48; H01L 23/3142; H01L 23/4952; H01L 23/49582; H01L 24/45; H01L 23/3107; H01L 24/29; H01L 23/495; H01L 21/02; H01L 23/00; H01L 23/29; H01L 23/31
    USPC ....................................................... 257/676
    See application file for complete search history.

(56) References Cited

U.S. PATENT DOCUMENTS

| | | | |
|---|---|---|---|
| 5,033,615 A * | 7/1991 | Shima | H01L 21/67126 206/714 |
| 5,096,851 A | 3/1992 | Yamazaki et al. | |
| 6,107,690 A | 8/2000 | Courtenay et al. | |
| 6,183,267 B1 * | 2/2001 | Marcus | H01L 21/4853 257/E23.068 |
| 6,368,899 B1 * | 4/2002 | Featherby | H01L 23/293 257/E23.025 |
| 6,852,567 B1 * | 2/2005 | Lee | H01L 23/3142 438/106 |
| 7,540,950 B2 | 6/2009 | Riedl et al. | |
| 7,656,034 B2 | 2/2010 | Iguchi et al. | |
| 7,781,897 B2 | 8/2010 | Hosseini et al. | |
| 9,666,501 B2 * | 5/2017 | Haga | H01L 21/4842 |
| 9,847,280 B2 * | 12/2017 | Haga | H01L 23/49513 |
| 2003/0137032 A1 * | 7/2003 | Abbott | H01L 23/49582 257/666 |
| 2004/0061433 A1 * | 4/2004 | Izuno | H01L 21/76251 313/498 |
| 2007/0080391 A1 * | 4/2007 | Hoeglauer | H01L 24/03 257/315 |
| 2009/0026560 A1 * | 1/2009 | Wombacher | H01L 23/055 257/415 |
| 2009/0032943 A1 | 2/2009 | Shoji et al. | |
| 2009/0072395 A1 | 3/2009 | Iguchi et al. | |
| 2009/0146280 A1 | 6/2009 | Shimazaki et al. | |
| 2009/0236729 A1 * | 9/2009 | Fann | C22C 12/00 257/692 |
| 2011/0278568 A1 * | 11/2011 | Pagani | H01L 24/05 257/48 |
| 2012/0267784 A1 | 10/2012 | Hosseini et al. | |
| 2013/0071971 A1 | 3/2013 | Kajiwara et al. | |
| 2013/0277825 A1 * | 10/2013 | Zhang | H01L 23/293 257/734 |
| 2014/0042603 A1 * | 2/2014 | Hosseini | H01L 24/29 257/676 |
| 2014/0110838 A1 | 4/2014 | Rogalli et al. | |
| 2014/0264383 A1 * | 9/2014 | Kajiwara | H01L 23/293 257/77 |
| 2017/0338165 A1 * | 11/2017 | Koerner | H01L 23/495 |

FOREIGN PATENT DOCUMENTS

| | | |
|---|---|---|
| DE | 68923732 T2 | 1/1996 |
| JP | 2013197531 A | 9/2013 |

OTHER PUBLICATIONS

Lee et al., "Copper versus Palladium Coated Copper Wire Process and Reliability Differences"; IEEE Electronic Components and Technology Conference 2014, pp. 1539-1548.

Villa et al., "Extended Lifetime Study of Copper and Copper-Palladium Bonding Wires", Automotive Electronics council (AEC)

(56) References Cited

OTHER PUBLICATIONS

Annual Reliability Workshop, Apr. 28-30, 2015, Detroit.
Krinke et al., "High temperature degradation of palladium coated copper bond wires"; Microelectronics Reliability, 2014, 6 pages, vol. 54, issue 9-10.
Michel et al., "Printing Meets Lithography: Soft Approaches to High-Resolution Patterning", IEEE Ibm Journal of Research and Development, Sep. 2001, pp. 697-719, vol. 45 No. 5.
Paunovic, "Electroless Deposition of Copper", Modem Electroplating, 2010, pp. 433-446, Fifth Edition.
Chinese Office Action received for corresponding CN application No. 201710358120.2 dated Mar. 4, 2019, 4 pages (for informational purpose only).
Chinese First Search Report for corresponding CN application No. 201710358120.2 dated Feb. 20, 2019, 2 pages (for informational purpose only).

* cited by examiner

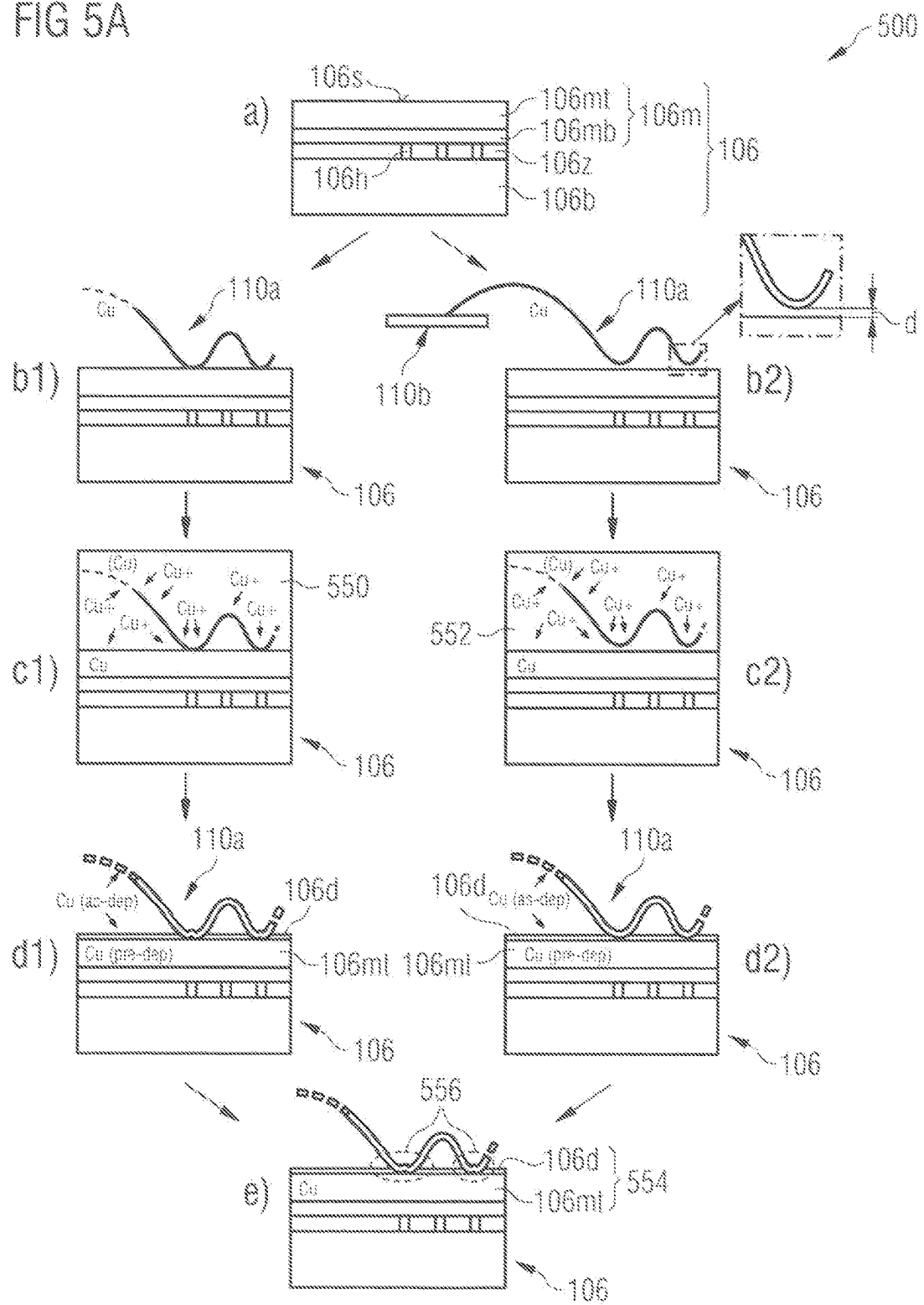

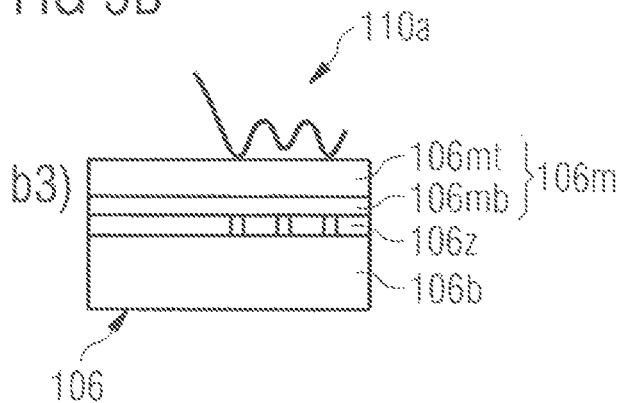
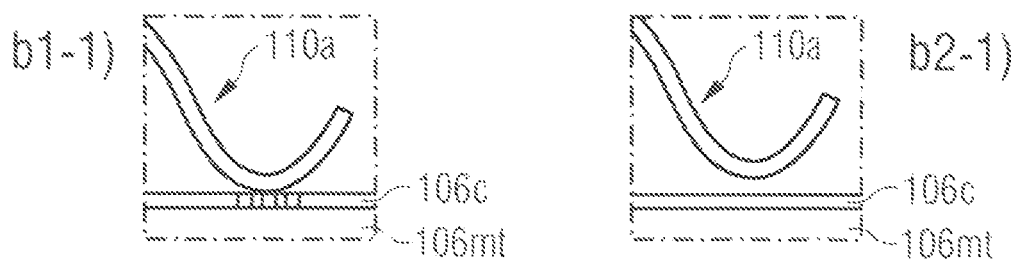
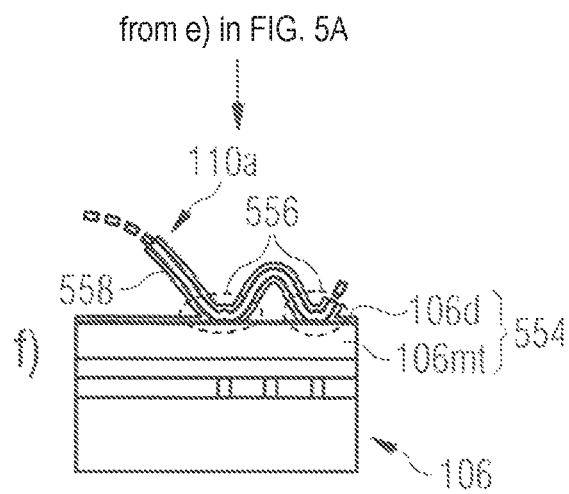

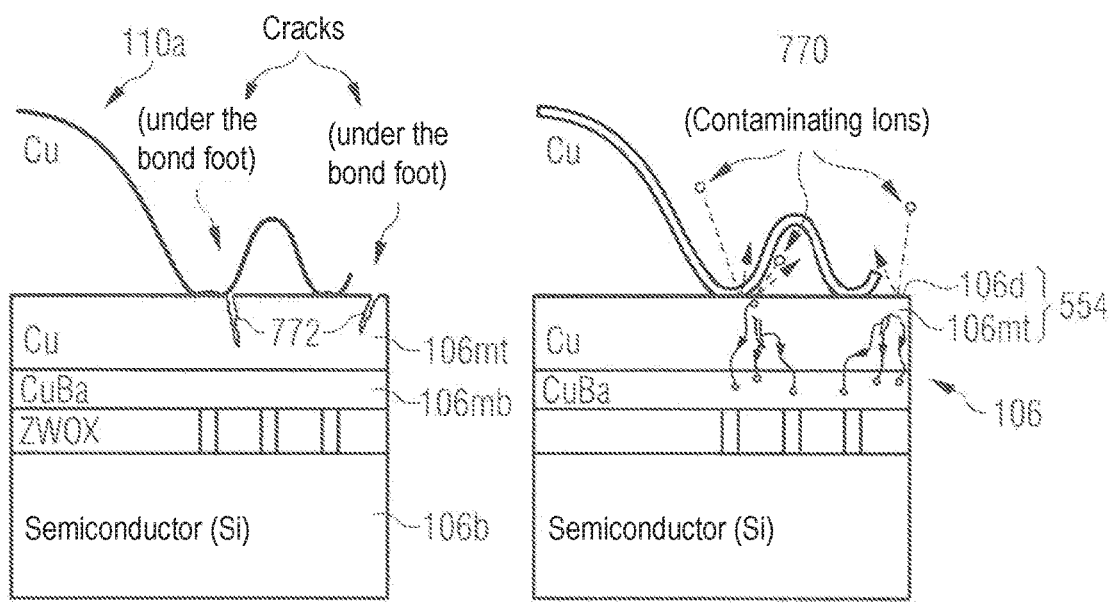

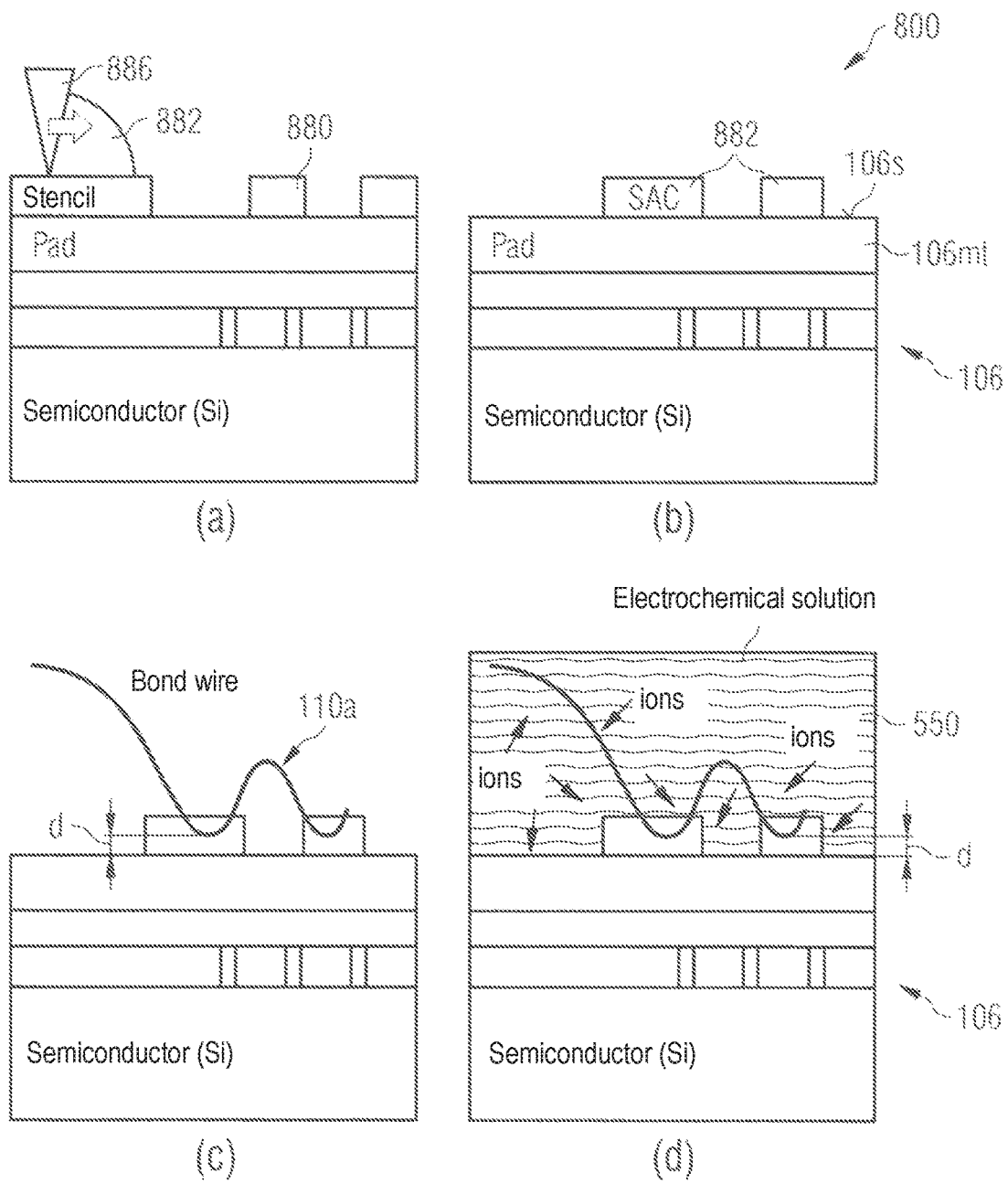

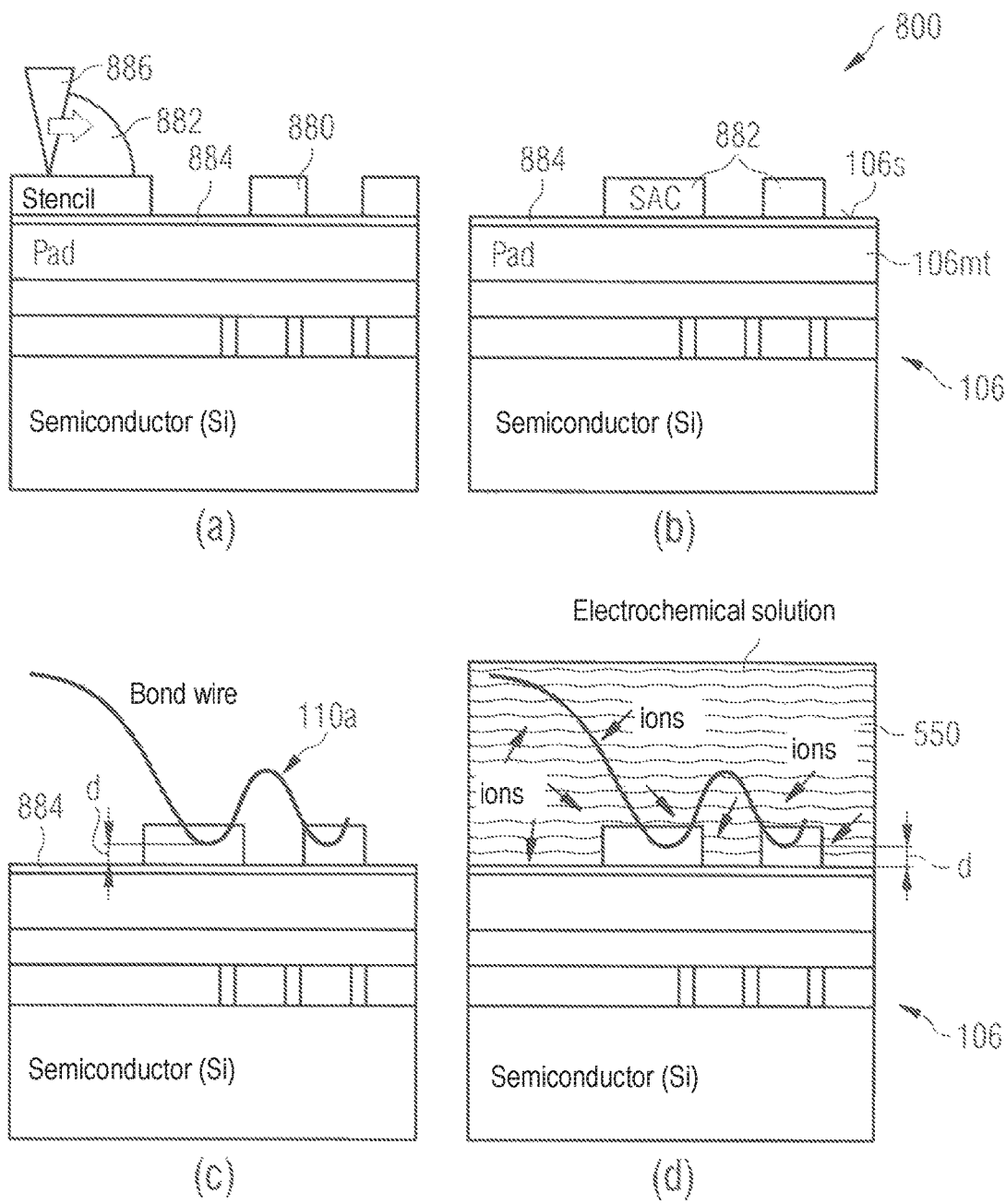

FIG. 12

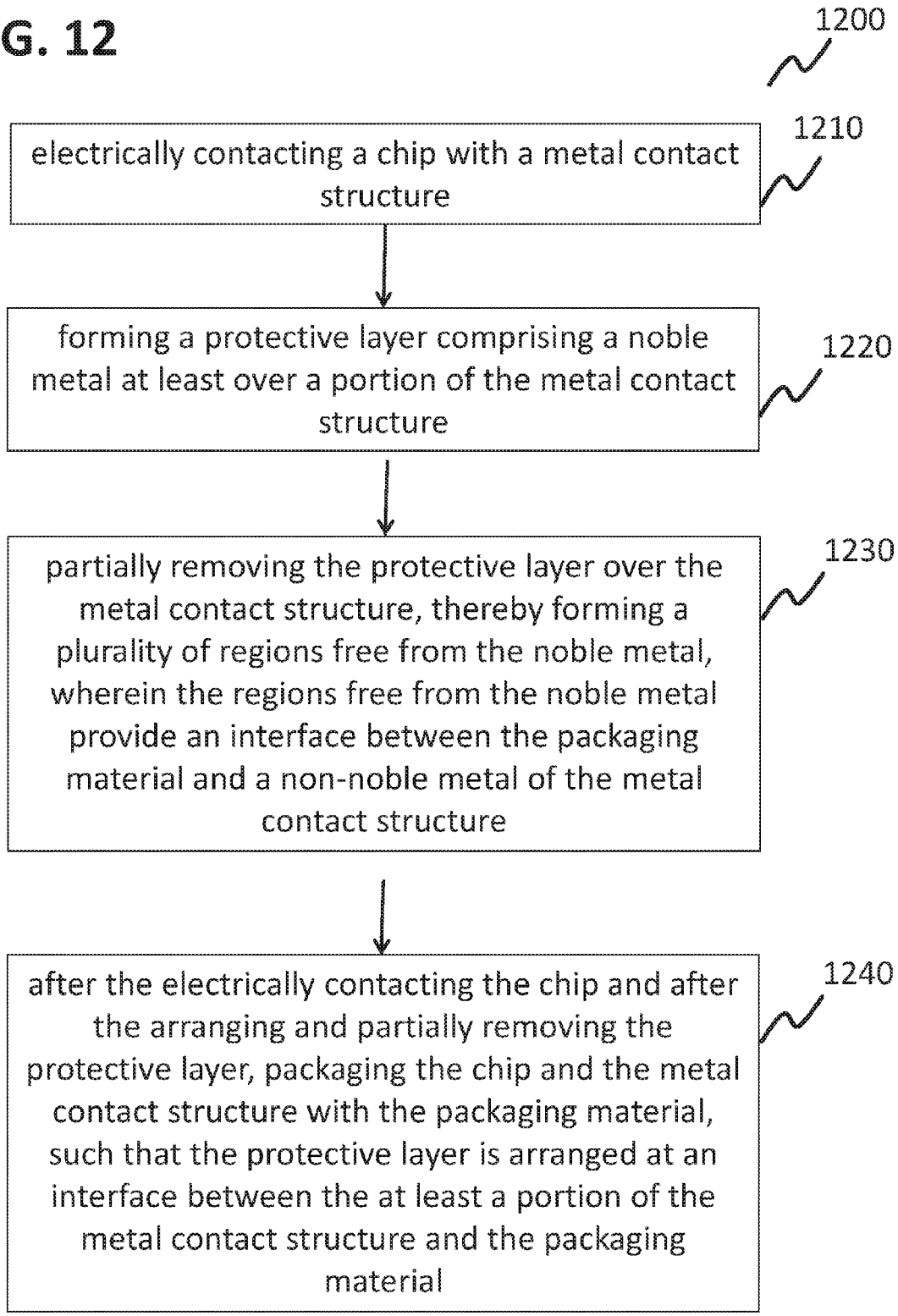

- 1200
- 1210 electrically contacting a chip with a metal contact structure
- 1220 forming a protective layer comprising a noble metal at least over a portion of the metal contact structure
- 1230 partially removing the protective layer over the metal contact structure, thereby forming a plurality of regions free from the noble metal, wherein the regions free from the noble metal provide an interface between the packaging material and a non-noble metal of the metal contact structure
- 1240 after the electrically contacting the chip and after the arranging and partially removing the protective layer, packaging the chip and the metal contact structure with the packaging material, such that the protective layer is arranged at an interface between the at least a portion of the metal contact structure and the packaging material

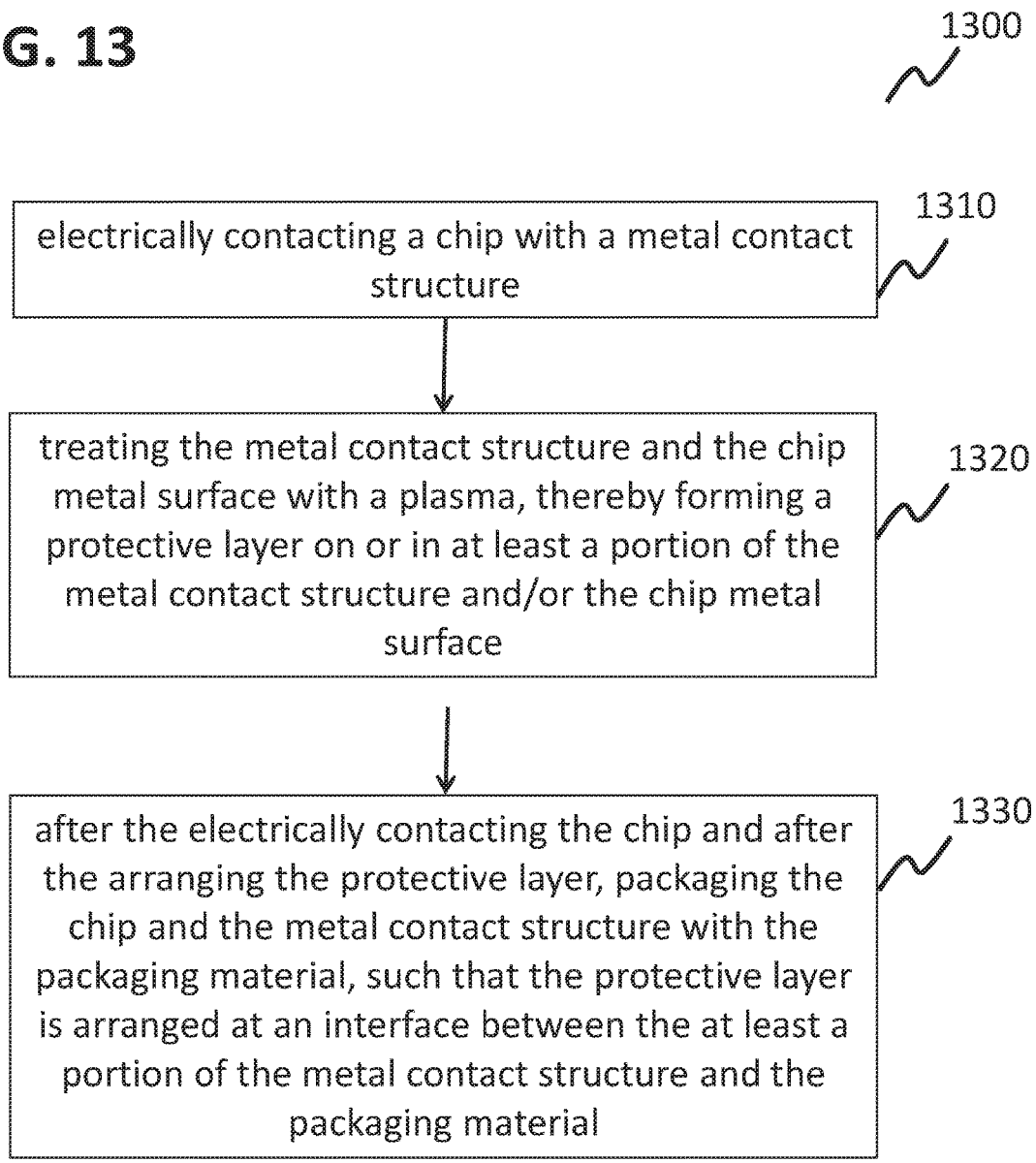

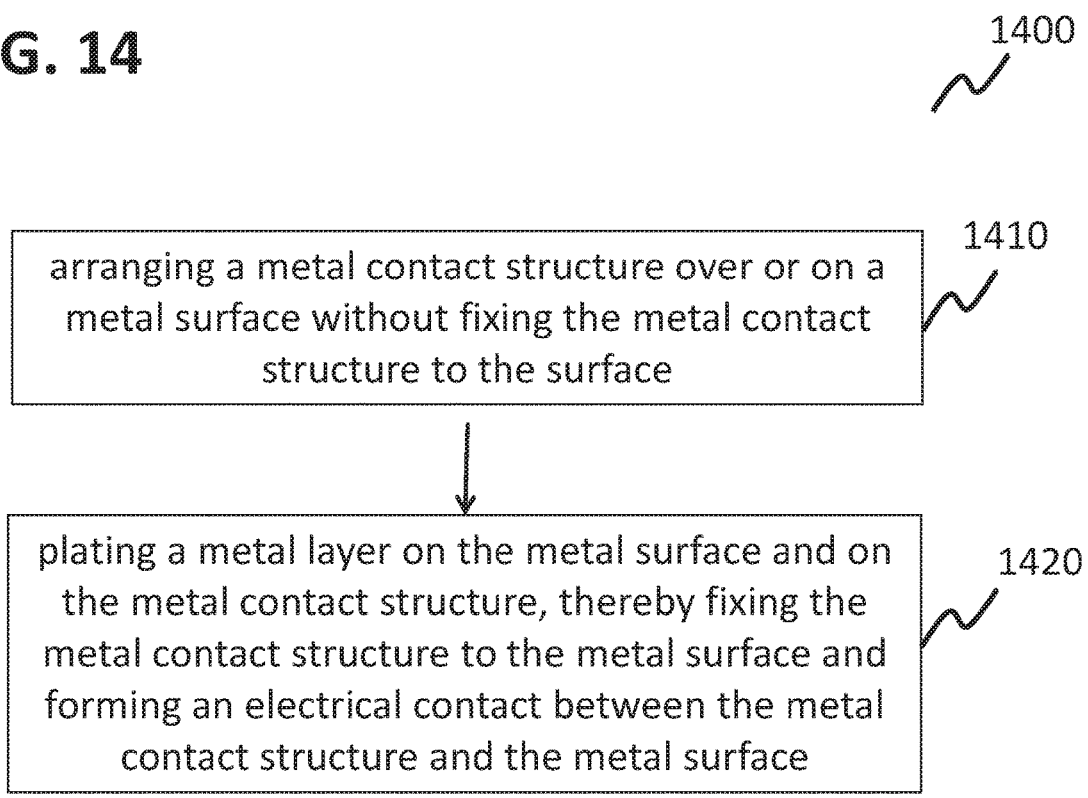

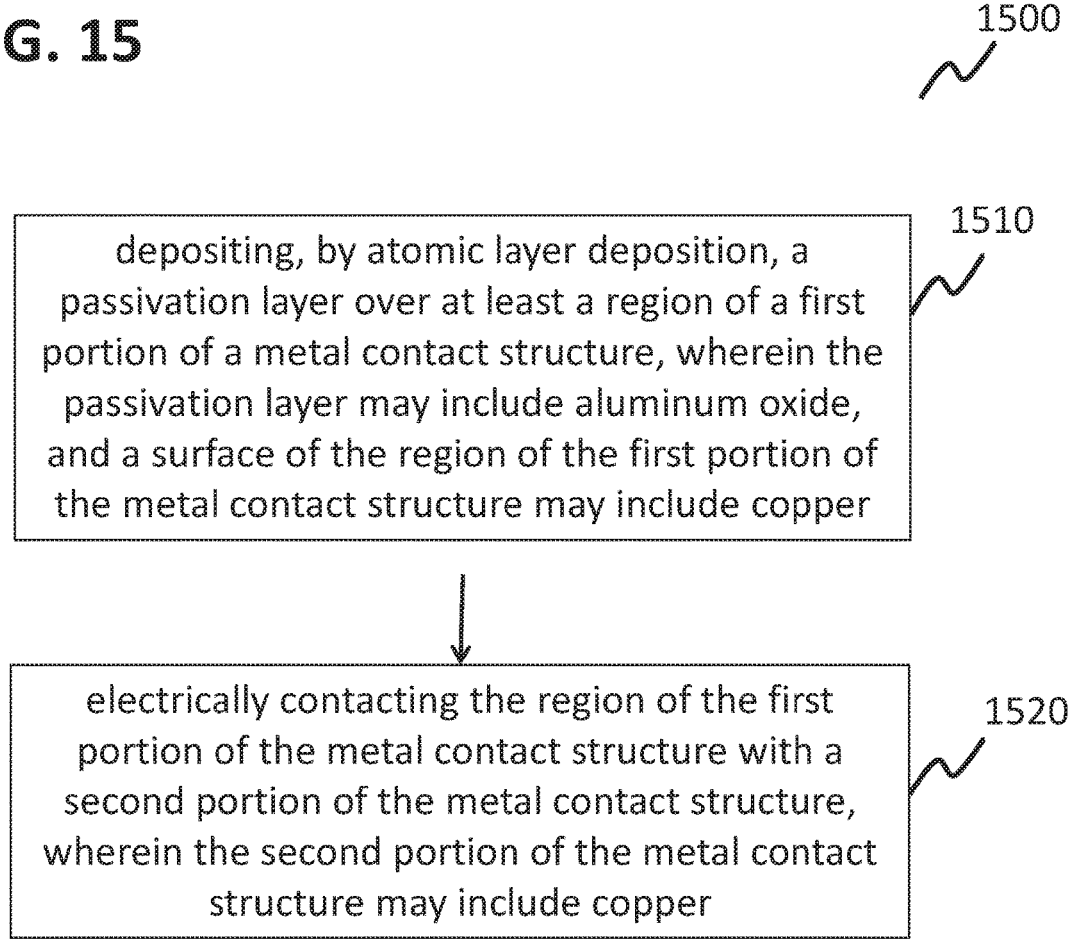

CHIP PACKAGE AND METHOD OF FORMING A CHIP PACKAGE WITH A METAL CONTACT STRUCTURE AND PROTECTIVE LAYER, AND METHOD OF FORMING AN ELECTRICAL CONTACT

CROSS-REFERENCE TO RELATED APPLICATION

This application claims priority to German Patent Application Serial No. 10 2016 109 349.1, which was filed May 20, 2016, and is incorporated herein by reference in its entirety.

TECHNICAL FIELD

Various embodiments relate generally to a chip package, a method of forming a chip package, and a method of forming an electrical contact.

BACKGROUND

A chip package may usually include a chip, a metal contact structure electrically contacting the chip, and packaging material at least partially enclosing the chip and the metal contact structure. The metal contact structure may provide an electrically conductive connection to the chip from outside the packaging material. The metal contact structure may include a bond wire, which may include or consist of copper (Cu). Bond wires made of bare Cu material may have a significant cost advantage compared to gold (Au) wire, which has been, and still is, the main wire material used. However, Cu wire may have some technological disadvantages and drawbacks, which hindered its rapid usage and industrial acceptance. For example, copper is easily oxidized at ambient air. Therefore, its shelf life time is very limited and strict rules may be applied in assembly fabs (e.g. shipment in sealed packages with inert media, limited hours of usage once the sealed package is opened, etc.).

Furthermore, Cu bond interconnects may often and more easily (e.g. more easily than interconnects using gold wire) undergo corrosion in stress tests using moisture levels (e.g. Temperature Humidity Bias (THB), Highly Accelerated Stress Test (HAST), Unbiased Temperature/Humidity Accelerated Stress Test (UHAST), or Unbiased Temperature/Humidity Autoclave (AC)).

And yet furthermore, Cu wedge bond interconnects may show weak bonding and adhesion, especially on surfaces which are coated with noble metals (e.g. gold (Au), silver (Ag), or palladium (Pd)) and which have a smooth, not roughened surface.

Similar drawbacks may occur for silver (Ag) wires used as bond wires.

SUMMARY

In various embodiments, a chip package is provided. The chip package may include a chip, a metal contact structure including a non-noble metal and electrically contacting the chip, a packaging material, and a protective layer including or essentially consisting of a portion formed at an interface between a portion of the metal contact structure and the packaging material, wherein the protective layer may include a noble metal, wherein the portion of the protective layer may include a plurality of regions free from the noble metal, and wherein the regions free from the noble metal may provide an interface between the packaging material and the non-noble metal of the metal contact structure.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 5A shows, as schematic cross sections, various stages of two alternative processes of forming an electrical contact according to various embodiments;
FIG. 5B shows, as a schematic cross section, a stage of a process of forming an electrical contact according to various embodiments;
FIG. 5C shows, as two schematic cross sections, a stage of a process of forming an electrical contact according to two different embodiments;
FIG. 5D shows, as a schematic cross section, a stage of a process of forming an electrical contact according to various embodiments;
FIG. 7 shows schematic cross sections of two stages of a method of forming an electrical contact according to various embodiments;
FIGS. 8A and 8B each show, as schematic cross sections, various stages of a process of forming an electrical contact according to various embodiments;
FIG. 12 shows a process flow for a method of forming a chip package according to various embodiments
FIG. 13 shows a process flow for a method of forming a chip package according to various embodiments
FIG. 14 shows a process flow for a method of forming an electrical contact according to various embodiments;
and
FIG. 15 shows a process flow for a method of forming an electrical contact according to various embodiments.

DESCRIPTION

Figure 1A:
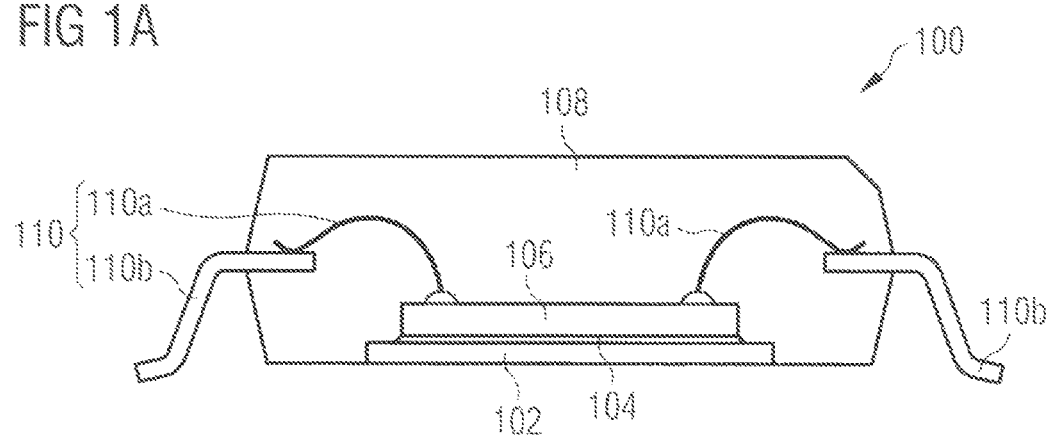
FIG. 1A shows a cross sectional view of a chip package.

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

Various aspects of the disclosure are provided for devices, and various aspects of the disclosure are provided for methods. It will be understood that basic properties of the devices also hold for the methods and vice versa. Therefore, for sake of brevity, duplicate description of such properties may have been omitted.

Many of the examples presented herein refer to a "sulfur-induced corrosion phenomenon" with copper (Cu), having Cu-sulfide ($CuS_x$) as corrosion product or with silver (Ag) having silver sulfide ($AgS_x$) as corrosion product. It should be noted that copper/silver, sulfur and their reaction products should be understood only as representative examples of reaction partners and reaction product, respectively, of a chemical reaction giving rise to the corrosion phenomenon, and not as the only and exclusive reaction partners, reaction product and corrosion phenomenon, respectively. Examples of materials and bond wires, respectively, which may be expected to be affected by the corrosion phenomenon include Cu-wire, palladium (Pd)-coated Cu wire, Au/Pd-coated Cu wire, Pd-doped Cu wire, Cu-wire doped with other noble metals, Ag-wire, doped Ag-wires, and coated Ag-wires. Similar corrosion reactions may occur with various other elements listed in the group VI (or 16) of the periodic table of elements (e.g. oxygen, sulfur, selenium, tellurium). A presence of more than one of these elements may aggravate the corrosion phenomenon.

Wires, e.g. bond wires, leadframes, pads, and other surfaces shown here, are also to be understood as representative examples. The corrosion reaction may also take place on other surfaces (e.g. metal surfaces) and interfaces (e.g. metal-packaging material interface) not explicitly shown.

Copper has replaced some traditionally used metals in some semiconductor applications. For example, copper wires may be used instead of gold wires, and copper layers, e.g. metallization layers, may be used instead of aluminum layers.

In semiconductor industries, a transition from aluminum (Al) to copper (Cu), for example, may have several reasons. For instance, a so-called damascene process, which may be used for forming a structured copper layer by depositing copper in openings formed in a substrate, may be one of the most important driving factors for logic devices, in order to improve performances in heat dissipation and electrical conduction.

A development of a so-called "power Cu metallization technology", in which a copper metallization may be used for transferring high amounts of power, aims at exploiting beneficial properties arising from a replacement of Al technology with Cu technology. Thereby, a suitable and reliable metal stack that may allow longer lifetime and higher short circuit robustness than currently obtainable with the standard Al technology may be achieved. A thick Cu layer may be capable of dissipating heat coming up to the chip front side more effectively than may be possible using just Al. The thicker the Cu, the better the abovementioned performances.

However, the use of Cu carriers, e.g. for at least a portion of a metallization layer, may have several disadvantages too, among which a stress exerted on the chip, Cu contamination of the chip and corrosion of the metal, e.g. the Cu, may be the most severe.

A high tensile stress arising from a deposited Cu layer may cause a wafer bow, which may make back-end operations difficult or even impossible. This may similarly apply to a chip once the wafers are sawn and the chips (also referred to as dies) undergo packaging operations.

The second main disadvantage of using Cu may be caused by an easy diffusion of Cu ions, e.g. into adjacent material, e.g. silicon, where the copper ions may react with silicon (Si) to form large CuSi grains which, in turn, may jeopardize the device performances and, in consequence, the device life time.

In order to minimize risks arising from a usage of thick Cu layers, an optimized "Cu barrier" stack has been under development for several years. The barrier may be required to play a dual role: firstly, to prevent migrating copper ions from reaching a surface of the silicon material, and secondly, to compensate the tensile stress. Several stacks have already been tested for getting both the two mentioned targets fulfilled. The stacks may include metals like W, Ti, TiN, Ta, TaN, etc., or combination of them. The metals may be deposited according to different deposition techniques, like sputtering or chemical vapor deposition (CVD), such that processable and reliable chips may have already been obtained on a wafer level.

Despite these developments in power Cu technology on the wafer-level, a limiting factor may come into play when a bonding process is considered. A Cu based wire bonding process may be desirable for ensuring a compatibility of a metal contact structure, e.g. a wire, with the pad metal. Such a replacement of a standard wire materials (e.g. gold) with copper introduces new challenges.

Mechanical properties of the copper may mainly be responsible for a very narrow process window within the current bonding technology, i.e. a very limited set of parameters under which a bonding may be performed, such that very few solutions may be available to find a reliable process to ensure a compatibility between the available Cu bonding and the Cu barrier stack.

A main approach for a solution in this direction may up to now have been an increase of the Cu thickness, which may in turn lead to additional stress on the chip, from which may result further challenges for the chip soldering (on the back side). Furthermore, even with the increased thickness of the Cu metallization, a challenge may result from the Cu bonding process, which may for example be a wedge bonding process. A Cu—Cu interface of the bond wedge and the metallization surface may be moved towards the diffusion barrier as result of ultrasonic power applied during the bonding. In extreme cases, this may form a path for contaminating ions through the metallization to the diffusion barrier.

Furthermore, the Cu wedge bond interconnects may show weak bonding and adhesion. A Cu—Cu interconnect may require a clean Cu surface, for example on a chip pad and/or on a landing area of, e.g., a leadframe. During a wirebonding process, the (clean) Cu surface may be exposed to heat, e.g. around or above 200° C., which may lead to an oxidation of the Cu surface, and thus to a weak Cu—Cu bonding.

For avoiding an oxidation during the bonding, the landing areas, e.g. chip pad, leadframe etc., may be coated with noble metals (e.g. gold (Au), silver (Ag), or palladium (Pd)). However, in particular in cases where the coatings may have a smooth, not roughened surface, these bonds, e.g., the Cu wedge bond interconnect, may also show weak bonding and adhesion. This may particularly apply in a case of stress, e.g. thermal stress, e.g. after a reliability test.

In general, conventional Cu bond interconnects may often and more easily (e.g. more easily than interconnects using gold wire) undergo corrosion in stress tests using moisture levels.

In order to overcome these problems, bond wire manufacturers are offering e.g. Cu wires that may be coated with noble metals like Pd, Pt or Au or Pd and Au or which may be doped with such noble metals. Similarly, Ag wires with noble metal coating or doping may offered. It had been expected that such noble metal coatings and dopings significantly reduce the oxidation and corrosion issues mentioned above. A typical example of such a coated wire 110a is shown in FIG. 2B. The coated wire 110a may include a core 110a0, which may for example include or consist of copper, a diffusion layer 110a1, which may include or consist of copper-palladium Cu—Pd, a palladium layer 110a2, and a gold-palladium layer 110a3.

However, it was found out that the noble metal coatings and dopings of Cu or Ag wires and other new or modified materials may significantly (may be even exclusively) contribute to a new corrosion problem explained in more detail below.

The problem has only been observed recently, and no solution appears to have been found so far. Reasons why the problem has not been observed in the past may include that mainly Au-wire has been used in the past, with Cu-wire (and particularly various new flavors of doped and coated Cu or other wire) having been introduced only recently, that new materials and surfaces have been introduced into electronic packages only recently, that changes to composition of molding compounds and other package materials have been made by suppliers only recently (e.g. adjustment of molding compound to improve, e.g. increase, an adhesion to new leadframe surfaces like PdAu or AuAg), and that devices are used in new and more aggressive applications only recently (e.g. operation at temperatures of 150° C. and above for extended duration (e.g. 1000 h and well above), or in ambient conditions which contain corrosive components (e.g. exhaust gases)), or recent applications in automotive and industrial market that call for operation over periods of 45000 h in total (trucks) or for operation at 70° C. for 7000 h in hybrid e-vehicle applications.

Bond wires of certain type (e.g. Cu-wire, Pd-coated Cu wire, Au/Pd-coated Cu wire, Pd-doped Cu wire, Cu-wire doped with other noble metals, Ag-wire, doped Ag-wires, coated Ag-wires, etc.) in packaged products may be attacked and corroded during operation or storage at elevated temperatures or during HTS tests or after stress combinations like moisture followed by high temperature stress, e.g. UHAST 48 h+HTGS at 175° C.

The corrosion may lead to a weakening or loss of bond adhesion at a $1^{st}$ and $2^{nd}$ bond (e.g. nailhead to pad, wedge to leadframe or substrate), and/or to a weakening of the mechanical strength of the wire due to material loss or structural change.

The corrosion may further lead to an electrical fail of the interconnect and of the device during operation before an anticipated end of life is reached. Core wire material has been observed to creep along the noble metal coating of the wire and to cover the whole wire. Additionally, core wire material has been observed to form dendrites into the molding compound under certain conditions.

According to analytical investigations, a root cause for corrosion of the mentioned wire materials may be an attack of e.g. Cu metal by e.g. sulfur containing components, leading to the formation of e.g. $CuS_x$ compounds. This corrosion reaction may especially be observed at a periphery of the $1^{st}$ bond or the $2^{nd}$ bond, an interface of the $1^{st}$ bond and of the $2^{nd}$ bond (e.g. to pad, leadframe or substrate), and/or within a wire loop (creation of pittings behind small defects in the coating)

Figure 1B:
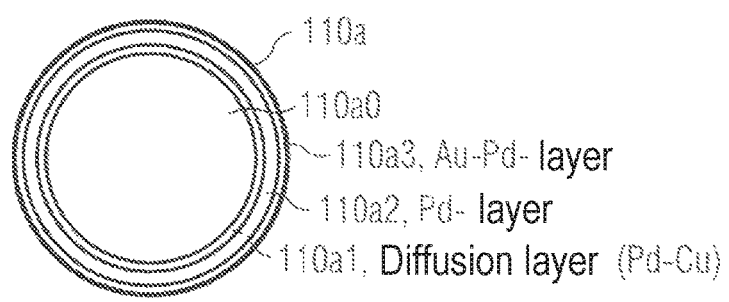
FIG. 1B shows a cross sectional view of a bond wire.

FIG. 1A shows a cross sectional view of a chip package 100, and FIG. 1B shows a cross sectional view of a bond wire 110a.

Figure 2:
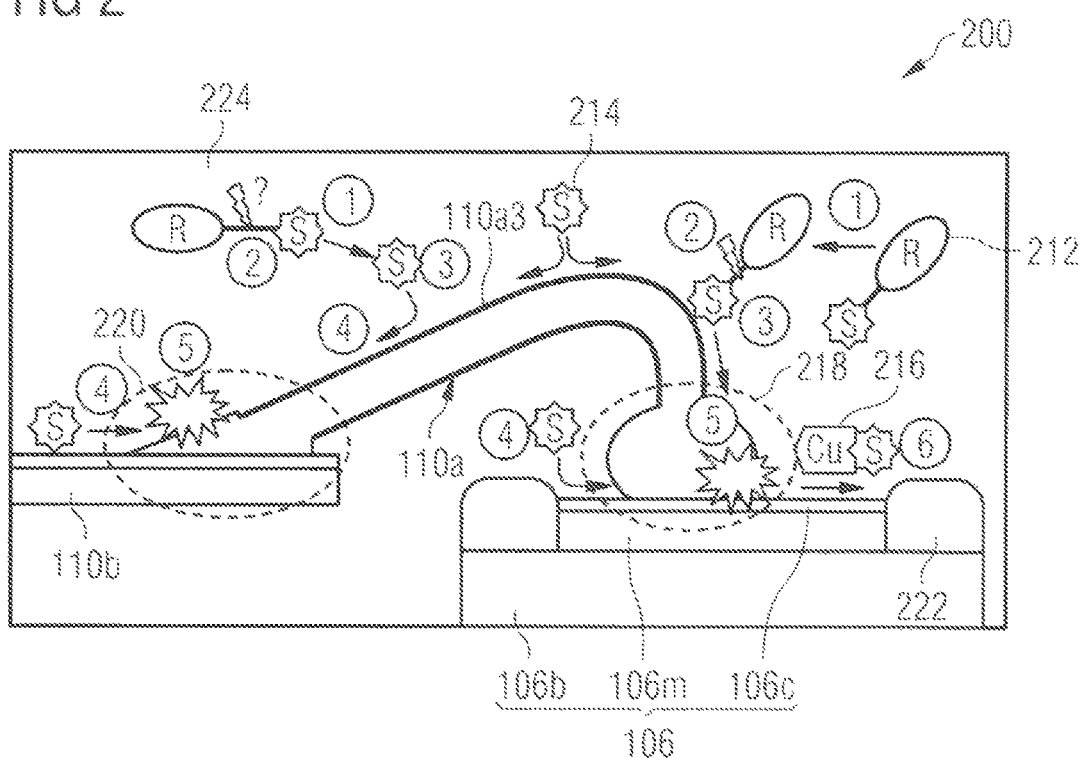
FIG. 2 shows a schematic cross section visualizing a corrosion process on metal surfaces in a chip package.

FIG. 2 shows a schematic cross section 200 visualizing a corrosion process on metal surfaces in a chip package.

The chip package may include a chip 106. The chip 106 may include a chip base 106b, which may for example include or consist of a semiconductor material, e.g. silicon. The chip 106 may further include a chip metal surface 106m, which may be protected by a cap layer 106c, which may be electrically conductive, e.g. a noble metal coating layer, for example including Pd and/or Au. The chip 106 may further include a chip edge region 106e.

The chip package may further include a metal contact structure 110, which may be electrically contacting the chip 106 (at the chip metal 106m). The metal contact structure 110 may include a wire 110a, which may be the portion of the metal contact structure 110 that may be electrically and physically contacting the chip 106 in a contact region 218. The electrically conductive contact may be formed as a so-called nailhead contact (due to a nailhead shape of the contacting end of the wire 110a). The wire 110a may be identical or similar to the wire 110a shown in FIG. 1A and FIG. 1B.

The metal contact structure 110 may further include a portion 110b. The portion 110b of the metal contact structure may provide an electrically conductive connection between the wire 110a and an outside of the package. An electrically conductive contact between the wire 110a and the portion 110b of the metal contact structure 110 may be wedge-shaped (the wedge shape may be caused by a pressure applied during a contacting process).

The chip package may further include packaging material 224, also referred to as molding compound. The packaging material 224 may for example include a resin or any other suitable dielectric packaging material 224 that may be used for being molded at least partially around the chip 106 and the metal contact structure 110. The packaging material 224 may at least partially encapsulate the chip 106 and the metal contact structure 110. The packaging material 224 may be in physical contact with surfaces, e.g. metal surfaces, of the chip 106 and/or of the metal contact structure 110. The packaging material 224 may for example be molded around the chip 106 and the metal contact structure 110. The chip and the metal contact structure may for example be hermetically encapsulated by the packaging material 224, wherein only ends of the metal contact structure 110, and optionally a back side of the chip 106, free from the encapsulation material 224 for providing an electrically conductive connection between the chip 106 and an outside of the chip package.

It has been observed that packaged products, for example metal surfaces in the chip package 100, e.g. the metal surface 106m of the chip 106 and/or of the metal contact structure 110 electrically contacting the chip 106, may be attacked and corroded during operation or storage at elevated temperatures or during high temperature storage (HTS) tests. A detrimental impact of other factors (e.g. humidity, bias, etc.) may not be excluded. Furthermore, the corrosion reaction may not be limited to high temperatures (e.g. ≥150° C.). It is observed to occur at significantly lower temperatures, even down to room temperature.

A rate of the reaction may depend on several parameters like concentrations of various species, temperature, texture and composition of metals, moisture level, etc, and thus an impact on operating lifetime of devices may be much more detrimental than initially observed in purely thermally accelerated investigations.

The corrosion may lead to a weakening or loss of adhesion at a $1^{st}$ bond (which may for example be a bond of a so-called "nailhead" of the wire 110a to the chip 106, e.g. to a metal surface 106m of the chip 106, which may also be referred to as a pad, a bond pad, or a metal pad) and/or at a $2^{nd}$ bond (which may for example be a bond of a so-called "wedge" (e.g. a pressed, and thus wedge-shaped end of the wire 110a) to the second portion 110b of the metal contact structure 110, e.g. a leadframe or a substrate). The corrosion may lead to an electrical fail of an interconnect and of a device, e.g. the chip package, during operation before an anticipated end of life is reached. Thus, a reliability of the device, e.g. the chip package, may be decreased.

Corrosion phenomena that have been observed in chip packages may have been caused by elements listed in group VI of the periodic table of elements, e.g. oxygen, sulfur, selenium, tellurium. In these observed examples, a location of the corrosion mainly focused on the bond wire 110a and its interfaces to e.g. the bond pad (on a top surface of the chip 106) or to the lead frame 110b.

However, the corrosion may also occur on any other surface or material that may be prone to the corrosion reaction described below or may be attacked by components containing the above mentioned harmful elements. A risk of corrosion may increase especially if the respective surface or material (e.g. metal surface or material) is in direct contact with the harmful component.

As an example, a corrosion attack on the nailhead of the wire 110a, on the metal bond pad 106m of the chip 106, and on the wedge end of the wire 110a is shown in FIG. 2.

In this example, the bond pad 106m may mainly include copper (Cu) metal. However, the corrosion may readily occur if the bond pad 106m mainly consists of any of the above mentioned metals that are prone to be attacked, of which the copper (Cu) is one example, and if the top surface of the pad 106m is not protected.

Corrosion may, however, also occur if the pad 106m has been protected by a thin (e.g. thinner than 20 nm) cap layer 106c of e.g. SiN, SiCN, $Al_2O_3$ or others. Such a cap layer 106c may be used to avoid an oxidation of the (Cu) pad 106m in an ambient environment after finishing a wafer production process. However, such a cap layer 106c may be (intentionally) disturbed by an impact of a bonding process in order to achieve a good mechanical and electrical contact once the singulated chips 106 are going to be packaged. At the disturbed locations, exposed core material may be prone to the corrosive attack.

The corrosion may continuously be ongoing (especially at elevated temperatures that may for example be caused by device operation or ambient temperature) and may finally lead to a disruption of the mechanical and electrical contact and to a functional failure of the device.

The corrosion reaction may not be restricted to occur only with surfaces or materials which mainly consist of Cu metal, but may also occur with surfaces or materials as described above and which may be attacked by components containing harmful elements.

Furthermore, the corrosion reaction may not be restricted to occur at the chip pad 106m. In general, surfaces or package components that may be prone to the corrosion phenomenon may include bond or contact pads 106m (either with initial cap layer 106c, also referred to as protection layer, or without), the portion 110b of the metal contact structure 110, e.g. lead frames, or other substrate materials containing the above mentioned metals, other interconnects than bond wires that may provide an electrical contact between a chip and a package substrate, between multiple chips, or between chip and other materials, which may include the metal contact structure 110 and other metal contact structures. Such interconnects may include bumps and micro-bumps, pillars, clips, springs, metal fillings in e.g. "through encapsulation" or "through mold compounds" or "through silicon" vias or other interconnects for 3-dimensional or vertical connection, metal layers on or in a (e.g. polymer) substrate of the package, chip top front side metallization, redistribution layers, chip backside metallization, passive components (e.g. inductors, capacitors, resistors), either on the chip or in the package, and other surfaces and components that may get in contact with the harmful components.

A model for a mechanism of the corrosion reaction is described below. A sequence of processes of the mechanism explaining transport kinetics and a degradation mechanism is schematically shown in FIG. 2 for an exemplary case of a palladium (Pd)-coated copper (Cu) wire in combination with sulfur species. The model may similarly apply to other materials and material combinations as described herein. The individual processes of the multi-step process are labelled by figures from 1 to 6.

In the example shown in FIG. 2, the nailhead in the first contact region 218, also referred to as bond region 218, and the pad 106m basically consist of the same element (e.g. Cu). Therefore, a galvanic element is not likely to form, and the mechanism of the corrosion may be different from those typically observed and described in the literature (e.g. corrosion in humid atmosphere, formation of local or galvanic elements, corrosion via formation of ions, are not likely to occur in this case).

Sulfur containing material, e.g. sulfur containing molecules 212 in the packaging material 224 (either made available intentionally or as contamination), may diffuse through the packaging material 224 (the molding compound) (marked with 1).

The sulfur-containing molecules 212 may easily and catalytically be decomposed (marked with 2) to a large extent, e.g. at low temperatures, leading to smaller S-containing fragments 214 that may be strongly adsorbed onto the noble metal surfaces, e.g. Pd-surfaces, e.g. the coating 110a3 of the wire 110a (marked with 3).

The decomposition products (adsorbed S-containing fragments 214) may easily and rapidly diffuse along the noble metal surfaces, e.g. the palladium (Pd) surface (marked with 4).

Whenever they reach unprotected Cu (or Ag) metal, the adsorbed S-containing fragments (also referred to as S-containing species) 214 may react irreversibly with the unprotected metal, e.g. the unprotected Cu- or Ag-wire, to form copper sulfide $CuS_x$ 216 or silver sulfide $AgS_x$, respectively (marked with 5). Unprotected Cu may mainly, or even only, be available at a location of the $1^{st}$ bond 218 and of the $2^{nd}$ bond 220 due to the bonding process, e.g. a FAB (free air ball) process or a wedge process. Therefore, these interconnect regions 218, 220 may degrade rapidly, which may lead to mechanically weak interconnects and to electrical failures.

The reaction products 216 (e.g. $CuS_x$ or $AgS_x$) may migrate easily along surfaces and interfaces due to creep corrosion (marked with 6). Especially sulfides of noble or semi-noble metals (e.g. Ag, Cu) may be prone to creep corrosion on surfaces of noble metals (e.g. Au, Pd) and on surfaces of organic materials (e.g. polyimide, mold resin). Therefore, no self-passivation but rapid corrosion of such metal interconnects may take place.

The corrosion reaction may be catalyzed or enhanced by the presence of the noble metals such as e.g. Pd, Pt, Au, and/or by alloys, by intermetallic compounds or by solid solutions of such noble metals, or by other intermetallic compounds like e.g. $AlCu_x$.

A root cause of the corrosion may thus be an attack of metal, e.g. Cu or Ag, by e.g. sulfur containing components (or chemically similar materials from group VI of the periodic table of elements, like e.g. O, Se, Te), leading to the formation of e.g. $CuS_x$ compounds. This corrosion reaction may be especially observed at a periphery of the $1^{st}$ bond and/or the $2^{nd}$ bond, interfaces of the $1^{st}$ and $2^{nd}$ bond (e.g. to pad, leadframe or substrate).

A source of the corrosive agent sulfur (or chemically similar materials as mentioned herein, e.g. other group VI elements, e.g. oxygen, sulphur, selenium, tellurium and/or polonium) may for example include or consist of components of the packaging material (the molding compound) 224, in which the chip 106 and the metal contact structure 110 may at least partially be encapsulated. The components of the molding compound 224 acting as the source of the corrosive agent may for example be a resin polymer, adhesion promoter, colouring material, etc., a contamination contained in the molding compound and its ingredients. Other sources of the corrosive agent may be or include other components within the package, e.g. glue for die attach, a contamination contained therein, and/or one or more components or contamination of the ambient (e.g. $H_2S$, $SO_2$, elementary sulfur, etc.).

An overall reaction rate may be influenced by further additives and contaminations. For example, ion catchers (e.g. catchers for $Cl^-$, $OH^-$) may be present in the mold compound, and/or moisture may be present at or near reaction sites. The corrosion reaction may not be limited to high temperatures (e.g. $\geq 150°$ C.), but may be observed to occur even at significantly lower temperatures, down to room temperature. Furthermore, the rate of the corrosion reaction may depend on several parameters like concentration of various species, temperature, texture and composition of metals, moisture level, electrical bias etc., and thus impact on operating lifetime of devices can be much more detrimental than initially observed in purely thermally accelerated investigations. Thus, for the intrinsic degradation mechanism, several further influencing factors may have to be expected in package and product environment, leading to a varying extent of degradation that may be difficult to predict and/or control.

While the noble metal coating 110a3 may protect the copper core 110a0 of the wire 110a in most regions, it may catalyze a chemical reaction with the sulfur in regions where the copper is not protected, for example in the contact regions 218, 220.

A transport of adsorbed species 214 along the noble metal surfaces, for example along the wire with the coating 110a3, may be very fast.

The reaction products 216 may be prone to creep corrosion, therefore voluminous voids may grow.

According to various embodiments, a quality and/or a reliability of an interconnect in a chip package may be improved.

According to various embodiments, before forming a copper-copper-connection, e.g. before a bonding process, e.g between a first portion of a metal contact structure and a second portion of a metal contact structure, a passivation layer may be formed over at least a region of the first portion of the metal contact structure. The passivation layer may consist of aluminum oxide. The passivation layer may be formed by atomic layer deposition (ALD). The passivation layer may be thin enough to allow an electrical contacting of the copper without a partial removal of the layer before the bonding. In other words, the passivation layer may be removed where the bond is formed by the bonding process itself. Thereby, an oxidation of the copper before and/or during the bonding process may be avoided, and thus a contact quality may be improved.

According to various embodiments, the corrosive attack of bond wires and/or other metal surfaces in the chip package by aggressive sulfur-containing or other components may be either significantly reduced or completely avoided. This may be achieved by forming a protective layer on (e.g. coating of) the wire and/or its interfaces to the chip and/or other package components, e.g. metal surfaces, with a protective layer after an electrical contacting of the chip, e.g. wire bonding, but before molding. The protective layer, e.g. the coating, may inhibit, reduce or slow down the corrosive attack. Thus, the degradation of the electrically conductive connection, e.g. the wire interconnect, may be minimized or completely suppressed and the detrimental impact on the wire interconnect reliability and lifetime may be significantly reduced.

In various embodiments, an interconnect degradation may be prevented by post-bond-process treatment of devices. A protective coating of specific surfaces or all surfaces in a package after performing the bonding process, or more generally the contacting process, may be performed.

In various embodiments, the coating material may not or not only consist of one or more noble metals, which may be known to strongly adsorb and catalytically decompose e.g. sulfur containing compounds and/or which may be known to support the rapid diffusion of e.g. sulfur containing fragments along its surfaces and/or which may be known to allow creep corrosion of reaction products like e.g. $CuS_x$ or $AgS_x$. The coating or doping material may include one or more metals that may form stable compounds, e.g. with corrosive elements, e.g. metal-sulfur compounds. Thus, sulfur or other corrosive fragments may be irreversibly bonded and fixed and may not be available for corrosive attack of the wire core material.

In various embodiments, a wire bond interconnect degradation may be prevented by optimized bond wire and metal surfaces. Bond wires (and/or other metal surfaces) in which a core material (e.g. Cu, Ag, etc.) may be partly or completely protected or shielded by a more effective coating or doping than noble metals may be used in the chip package. This may avoid or at least significantly reduce e.g. the catalytic decomposition of sulfur containing compounds and other compounds as described above at metal surfaces, the rapid diffusion of e.g. metal-$S_x$-compounds along the wire or other metal surface, and/or the creep corrosion of reaction compounds, e.g. Cu—$S_x$-compounds.

In various embodiments, the corrosion problem may be solved by either significantly reducing or completely avoiding the corrosive attack of bond wires by aggressive sulfur-containing or other (selenium-, tellurium- or oxygen-containing) components. This may be achieved by coating with a protective layer after wirebonding, but before molding. The coating may hinder or slow down the corrosive attack. The coating may cover either only the unprotected core wire material, the complete bond wire, all electrically conductive surfaces, or all surfaces in the package.

According to various embodiments, a quality and a reliability of a chip package may be improved by forming an electrically conductive contact having a high electrical conductivity, by providing the electrically conductive contact with an increased mechanical stability, and/or by avoiding a corrosion in the package. For the electrically conductive contact with the high electrical conductivity, a copper surface may be provided with an aluminum oxide layer before forming the electrically conductive contact. For increasing a mechanical stability of the electrically conductive contact, a copper layer may be plated over the metal surfaces of the electrically conductive contact, and for avoiding the corrosion, one or more metal surfaces in the package may be partly or completely protected or shielded by a more effective coating or doping than noble metals for avoiding or at least significantly reducing e.g. the catalytic decomposition of sulfur (etc.) containing compounds.

In various embodiments, a selective deposition of electrically conductive (metallic, metalloid or semiconducting) materials on electrically conductive surfaces and interfaces of the device or selective coating of electrically conductive surfaces and interfaces of the device with electrically conductive (metallic, metalloid or semiconducting) materials may be performed after performing the electrical contacting, e.g. wire bonding, process and before providing the molding compound to the package.

In various embodiments, electrically conductive (metallic, metalloid or semiconducting) materials may be deposited selectively or non-selectively on electrically conductive surfaces and interfaces of the device, e.g. the chip, e.g. the chip metal surface, and the metal contact structure, after performing the connecting, e.g. wire bonding, process. The deposited electrically conductive materials may include or consist of metals, alloys, oxides, phosphates, vanadates, and/or molybdates, for example Al, Ta, Co, Ti, W, Co(P), CoWP, V, Mn, Zr, Mo, Au, Ru, Rh, Zr, Re, Ir, amorphous carbon or other carbon rich material. In a case of depositing non-selectively, an activation may be performed, for example by heat, laser, radiation, and/or bias. Excessive, non-reacted material of the electrically conductive material, also referred to as overburden, may be removed, e.g. physically or chemically.

In various embodiments, the materials and processes of choice for forming the electrically conductive protective layer on or in one or more of the metal surfaces in the chip package, for example on or in the metal contact structure 110, e.g. the wire 110a or the portion 110b, or on or in the chip metal surface 106m, may include depositing of Pd, Al, Ni, Ta, Co, Ti, W, and/or others by a selective atomic layer deposition (ALD) process, a selective chemical vapor deposition (CVD) process, a selective plasma-enhanced chemical vapor deposition (PECVD) process, or a selective low pressure chemical vapor deposition (LPCVD) process, depositing Pd, Ni, Ni(P), NiMoP, Co, Co(P), CoWP, Mo, Cr, Au, and/or or alloys by selective electroless deposition, and/or despositing Zn, Cr, Au, Pd, Ni, Sn, Mo, Co, V, Mn, Ru, Rh, Zr, Ta, W, Re, and/or Ir by selective e-biased deposition, e.g. electroplating.

In various embodiments, the combinations, alloys, vanadates, and/or molybdates of the materials mentioned above, including the e.g. (commercial) coatings like e.g. tin based coatings (like Olin brass supplied by Olin Metal Research Laboratories and modifications to that), may be deposited by selective e-biased deposition, e.g. electroplating.

In various embodiments, materials and processes of choice for forming an electrically conductive protective layer may include depositing Al non-selectively on or in one or more of the surfaces in the chip package, for example at least including chip surfaces with unprotected Cu areas. After a temper process, Al may diffuse into Cu to form a CuAl intermetallic compound. Unreacted Al may be etched selectively, and the Cu surface may be protected by the AlCu intermetallic compound.

In various embodiments, the protective layer may include or consist of a coating of the core wire material with one or more metals of the group of nickel (Ni), cobalt (Co), chromium (Cr), titanium (Ti), Vanadium (V), manganese (Mn), zirconium (Zr), molybdenum (Mo), tin (Sn) and zinc (Zn), etc., of a coating of the core wire material with one or more alloys which are composed of the core wire material (e.g. Cu) and one or more of the metals of the group of nickel (Ni), cobalt (Co), chromium (Cr), titanium (Ti), Vanadium (V), manganese (Mn), tin (Sn), palladium (Pd), gold (Au), zinc (Zn) zirconium (Zr), and molybdenum (Mo), which includes also alloys which are commercially available and in industrial use such as e.g. "monel" (Ni0.66Cu0.33 alloy), which is a trademark of Special Metals Corporation, Huntington (W.V.), USA, of a coating of the core wire material with one or more binary or ternary alloys, intermetallic phases or solid solutions of the group of nickel (Ni), cobalt (Co), chromium (Cr), titanium (Ti), Vanadium (V), manganese (Mn), tin (Sn), palladium (Pd), gold (Au), silver (Ag) zinc (Zn), zirconium (Zr), and molybdenum (Mo), of a coating of the core wire material with a nitride, carbide, boride, or aluminate of the group of nickel (Ni), cobalt (Co), chromium (Cr), titanium (Ti), Vanadium (V), manganese (Mn), tin (Sn), palladium (Pd), gold (Au), zinc (Zn), zirconium (Zr), and molybdenum (Mo), or of a doping of the core wire material (either coated or uncoated) with one or more metals of the group of nickel (Ni), cobalt (Co), chromium (Cr), titanium (Ti), Vanadium (V), manganese (Mn), tin (Sn), palladium (Pd), gold (Au), silver (Ag) zinc (Zn) zirconium (Zr), molybdenum (Mo), and antimony (Sb).

Noble metals like Au, Ag and Pd are explicitly listed here because certain alloys like e.g. PdNi, with a nickel fraction by weight in the range of 0.2-0.7 (in other words, the PdNi-alloy including 20% to 70% of nickel) are known to have excellent protection properties, but do not catalyze, enhance or support the decomposition of adsorbed species, especially adsorbed sulfur species, as pure noble metals do. Also, diffusion of such adsorbed species along the surfaces of such alloys is much less pronounced or even completely suppressed.

In various embodiments, either only the bond wire may be coated or doped with the metals or alloys specified above, or more or all metal surfaces in the package (e.g. also leadframe surfaces) may be coated or doped with one or more of the metals or alloys specified above. Instead of the bond wire, a different metal contact structure may be used and provided with the protective layer as described above.

In various embodiments, by using bond wires (and other metal surfaces) in which the core material (e.g. Cu, Ag, etc.) may be protected or shielded by a more effective coating or doping than noble metals, the following processes may be avoided or at least significantly reduced: a catalytic decomposition of sulfur containing and other compounds at metal surfaces, a rapid diffusion of e.g. metal-$S_x$-compounds along the wire or other metal surface, and a creep corrosion of reaction e.g. Cu—$S_x$-compounds.

In various embodiments, the protective layer, e.g. the coating or doping, may also be formed on/in other surfaces in the package, e.g. other than the bond wire or other than metal surfaces.

In various embodiments, the package may not contain any surface that is either composed by a noble metal (Au, Pd, Pt) or by an alloy or solid solution of these noble metals.

In various embodiments, a thickness of a noble metal layer surface at one or more parts of the package may be less than 20 nm, e.g. less than 10 nm.

In various embodiments, the package may include one or more surfaces that include or consist of a noble metal (Au, Pd, Pt) or an alloy or solid solution of these noble metals. However, one or more of these surfaces may include embedded or exposed islands of a different metal (for example of a core metal as described above, e.g. copper or silver). Such islands may act as scavengers for corrosive components. Pattern and density of the embedded or exposed islands may vary in a wide range.

In various embodiments, a thickness of the protective layer, e.g. the coating layer, which may include a plurality of individual layers, may be in the range of 1 nm to about 300 nm, e.g. in a range from 5 nm to about 200 nm, e.g from about 10 nm to about 100 nm, depending on the number of individual layers, e.g individual coating layers, and on the core wire diameter.

In various embodiments, concentrations of doping elements may be in a range from about 10 atomic ppm to about 10.000 atomic ppm, e.g. from about 50 ppm to about 5000 ppm, e.g. from about 100 ppm to about 1000 ppm, depending on a number of dopant elements and on desired wire properties (e.g. a wire hardness).

In various embodiments, a process for doping or coating the core wire may be any process that is industrially available for the purpose, e.g. electrolytic deposition, i.e. coating in an electrolytic bath, either before or after pulling the wire to its desired final diameter.

It may be understood that during a processing of a first bond (e.g. during FAB formation) and/or during a processing of a second bond (e.g. wedge process) of such wires as described above, the core material of the wire (e.g. Cu or Ag) may be exposed at the regions where the interconnects are formed. Accordingly, the core wire material may no longer be protected by e.g. the coating at these locations. However, it is pointed out that the coatings and dopings proposed in the above embodiments regarding a protective layer formed on/in the metal contact structure, e.g. the wire, may not enhance or even catalyze the decomposition of e.g. the sulfur containing components, may not allow the easy and rapid diffusion of e.g. sulfur containing components or its fragments along the wire surface, may not support, enhance or even catalyze the reaction of the core wire material with e.g. sulfur containing components or fragments, which would lead to the formation of e.g. $CuS_x$ or $AgS_x$, and may not support the rapid and easy creep corrosion of reaction products like e.g. $CuS_x$ or $AgS_x$ along its surface or interfaces to the same extent as pure noble metals (e.g. Pd, Pt, Au) may do.

Thus, in various embodiments, the detrimental corrosion attack and degradation of the interconnects may be significantly reduced and the interconnect reliability may be improved.

In various embodiments, only the bond wire may be coated or doped with the metals or alloys specified above.

In various embodiments, more or all metal surfaces in the package (e.g. also leadframe surfaces) may be coated or doped with one or more of the metals or alloys specified above.

In various embodiments, the package may not contain any surface which is either composed by a noble metal (Au, Pd, Pt) or by an alloy or solid solution of these noble metals.

In various embodiments, surfaces may be provided in the package that are either not or at least to a lower extent supporting, enhancing or catalyzing the degradation of bond interconnects due to the described corrosion reactions. Such surfaces may be specific bond wire surfaces and/or other surfaces of metal components in the package, e.g. of metal components as described above, that may be either doped or coated with specified metals or that may include exposed or embedded islands of such metals.

In various embodiments, a thickness of a noble metal layer surface at one or more parts of the package may be less than about 20 nm, for example less than about 10 nm. Experiments confirmed that this limitation of noble metal layer coating thickness may provide a solution to the corrosion issue. This may for example in particular be the case if the corresponding surfaces (e.g. leadframe surface) are roughened and/or if the core material of the particular package component (e.g. leadframe) is composed of e.g. nickel (Ni), cobalt (Co), chromium (Cr), titanium (Ti), Vanadium (V), manganese (Mn), tin (Sn), zinc (Zn), zirconium (Zr), molybdenum (Mo) or other metal that may form stable compounds, e.g. metal-sulfur compounds, but that may however not show creep corrosion but self-passivation and thus may not lead to interconnect degradation.

In various embodiments, the package may include one or more surfaces that may be composed either of a noble metal (Au, Pd, Pt) or of an alloy or a solid solution of noble metals. However, one or more of these surfaces may have embedded or exposed islands of a different metal, which may include or be composed of e.g. nickel (Ni), cobalt (Co), chromium (Cr), titanium (Ti), Vanadium (V), manganese (Mn), tin (Sn), zinc (Zn) zirconium (Zr), molybdenum (Mo), or other metal that may form stable compounds, e.g. metal-sulfur compounds, that may not show creep corrosion but self-passivation and thus may not lead to interconnect degradation. Sulfur and/or other corrosive fragments may be irreversibly bonded and fixed at these embedded or exposed metal islands. Thus, they may not be available for corrosive attack of the core wire material (e.g. Cu, Ag) and thus corrosive degradation of the bond interconnect may be avoided or at least significantly reduced. Pattern and density of the proposed embedded or exposed islands of a different metal can vary in a wide range.

In various embodiments, the embedded or exposed islands may have a size larger than about 1 nm, e.g. larger than about 2 nm, e.g. larger than about 5 nm, e.g. larger than about 10 nm, e.g. larger than about 50 nm, e.g. larger than about 100 nm. Herein, the term size may refer to a diameter of an essentially circular island, or to a length of a largest extent in a case of the island not having an essentially circular shape, but rather ellipsoidal, polygonal, or any other shape. In various embodiments, a total fractional area covered by the plurality of islands, e.g. a percentage of area covered by the plurality of islands as compared to a total area of the metal surface, e.g. the lead frame, may be larger than about 5%, e.g. larger than about 10%, e.g. larger than about 20%.

In various embodiments, electrically non-conductive inorganic materials may be deposited selectively on electrically conductive surfaces and interfaces of the device, e.g. the chip and the metal contact structure, or non-selectively on any surface of the device, after performing the connecting, e.g. wire bonding, process. The electrically non-conductive organic materials may include or consist of $Al_2O_3$, $AlN_x$, $SiO_2$, $SiN_x$ with or without embedded catchers for certain elements.

In various embodiments, a chip package may be provided. The chip package may include a chip including a chip metal surface, a metal contact structure, the metal contact structure electrically contacting the chip metal surface, a packaging material, and a protective layer including or consisting of a portion formed at an interface between a portion of the metal contact structure and the packaging material, wherein the protective layer may include or essentially consist of at least one material of a group of inorganic materials, the group consisting of aluminum oxide, copper oxide, amorphous or crystalline silicon dioxide, tetraethyl orthosilicate, a nitride, a phosphate, a carbide, a boride, an aluminate, amorphous carbon or other carbon-rich material, a compound comprising nitrogen and the metal of the chip metal surface and/or of the metal contact structure, and a compound including silicon and the metal of the chip metal surface and/or of the metal contact structure.

In various embodiments, surfaces, e.g. all surfaces, of the device may be plasma-treated, e.g. with N-, C- or O- (e.g. $N_2$-, $NH_3$-, $N_2O$) containing plasma, after performing the electrical contacting (connecting), e.g. wire bonding, process. In various embodiments, the plasma-treatment may be performed immediately before providing the molding compound to the package. Thereby, a protective layer may be formed. As the plasma, a radio frequency (RF-), microwave or remote plasma may be used.

For example, a treating of the surfaces with the N-containing plasma (e.g. $N_2$, $NH_3$, $N_2O$) may form a protective layer, e.g. a protective surface coating, e.g. a metal-nitrogen surface coating like $Cu_xN$, $Cu_xNH$, or $Ag_xN$.

For example, a treating of the surfaces with the O-containing plasma (e.g. $O_2$, $O_3$, $N_xO$) may form a protective layer, e.g. a protective surface coating, e.g. a metal-oxide or metal-oxygen-nitrogen surface coating like CuO; $Cu_xON$.

In various embodiments, the protective layer(s), e.g. the thin coating(s) created by the plasma treatment may have a high affinity to Cu and Ag surfaces and may strongly adhere to them and other surfaces and thus protect them from corrosive attack.

A patterning of the protective layer formed by the plasma treatment may not be required, because the protective layer may be non-conductive.

In various embodiments, all surfaces of the device may be (pre-)treated with Si-containing species e.g. siloxanes or polysiloxanes.

In various embodiments, a treatment of surfaces, e.g. all surfaces in the package, with Si-containing species (e.g. $SiH_4$-derivates, siloxanes, polysiloxanes) may be performed to form a protective layer, e.g. a protective metal-silicon surface layer like $CuSi_x$ or $AgSi_x$. The treatment may for example be performed shortly before the molding process in a different tool, immediately before the molding process in the molding tool as a pre-coating process, or as a first part of the molding process in the molding tool.

In various embodiments, materials and processes may be used that coat all electrically conductive surfaces, or coat preferably and/or selectively the material of the unprotected core $110a0$ of the bond-wire 100 (e.g. Cu or Ag) and its interfaces.

In various embodiments, materials may be used that do not form $M-S_x$ compounds or do not undergo $M-S_x$ creep corrosion on noble metals and/or plastics under typical application or stress conditions. For example, ZnS, MoS, SnS, and NiS do not show creep corrosion.

In various embodiments, materials may be used that do not enhance or catalyze the decomposition of e.g. sulfur containing species at its surfaces and which do not enhance or catalyze the formation of metal sulfides, especially not $CuS_x$ or $AgS_x$.

In various embodiments, electrically non-conductive organic materials may be deposited selectively on electrically conductive surfaces and interfaces of the device, e.g. the chip and the metal contact structure, or non-selectively on any surface of the device, after performing the connecting, e.g. wire bonding, process. In other words, a selective coating, e.g. deposition, of electrically non-conductive organic materials on electrically conductive surfaces and interfaces of the device or a non-selective coating, e.g. deposition, on any surface and interface of the device may be performed after performing the electrical contacting, e.g. wire bonding, process and before providing the molding compound to the package.

In various embodiments, materials and processes of choice for forming the protective layer of electrically non-conductive organic materials selectively on metal surfaces of the chip package or non-selectively on surfaces of the chip package may include N-containing organic materials like azoles (hetero-aromates with one or more N-atoms), hydrazines, amines or cyano-compounds and derivates thereof, like pyrazole, triazoles (e.g. benzotriazole (BTA), imidazole (IMD)) or oxazoles, tetracyanoquinodimethan (TCNQ) that may be applied to the surface(s) by dipping, spraying or any other suitable physical or chemical process. Compounds of this group may have a high bonding affinity towards certain metal surfaces and are known to form strong complexes with metals, and especially and partially selectively with Cu (e.g. BTA and other azoles, TCNQ).

The materials and processes of choice for forming the protective layer of electrically non-conductive organic materials selectively on metal surfaces of the chip package or non-selectively on surfaces of the chip package may further include imides, polyimides, parylenes (e.g. by CVD coating) or high performance thermoplastics (e.g. coating done by a solution of the polymers) or other paints or finishes, like SU-8 laquers.

The materials of choice for forming the protective layer of electrically non-conductive organic materials selectively on metal surfaces of the chip package or non-selectively on surfaces of the chip package may further include functionalized polymers, like polystyrene or polyethylenglycol with anchor groups both for metals and mold (an anchor group as used herein may refer to a functional group that preferably bonds to metals or mold constituents).

C—S bondings in functional groups of polymers or oligomers may be more resistant to decomposition than the same functional group in a monomer. Thus, in various embodiments, such polymers or/and oligomers may be used for forming the non-conductive organic protective layer.

In various embodiments, materials having a high affinity to Cu and/or Ag surfaces that may strongly adhere to them and thus protect from corrosive attack may be used for forming the protective layer. Such materials may for example include electron-rich N-containing organic compounds. The materials having a high affinity to Cu and/or Ag surface may be easy to apply with low-cost processes.

In various embodiments, a selective coating, e.g. selective deposition, of electrically non-conductive inorganic materials on electrically conductive surfaces and interfaces of the device or non-selective coating, e.g. deposition, on any surface and interface of the device may be performed after performing the electrical contacting, e.g. wire bonding, process and before providing the molding compound to the package.

In various embodiments, materials and processes of choice for forming the protective layer of electrically non-conductive inorganic materials selectively on metal surfaces of the chip package or non-selectively on surfaces of the chip package may include deposition of thin layers of Al-oxide ($Al_2O_3$) or Al-nitride ($AlN_x$) by either ALD, PECVD or PLCVD (selectively or non-selectively) or by PVD (non-selectively), deposition of thin layers of Si-oxide ($SiO_2$) or Si-nitride ($SiN_x$) by either ALD, PECVD or PLCVD (selectively or non-selectively) or by PVD (non-selectively). ttreatment with liquid chemicals, which may lead to the formation of surface oxides (e.g. $Cu_2O$: from an alkaline Cu-tatrate solution $Cu_2O$ can be deposited on surfaces), which may coat the corresponding metal surfaces with such oxides (e.g. Tetraethylorthosilicat, TEOS), or which may lead to the formation of metal-nitrogen complexes at the surface (e.g. Cu-amino-complexes), amorphous carbon or other carbon rich layers, $SiO_2$ or $Si_3N_4$ layers or any other ceramic layer deposited by e.g. PLCVD, and deposition of thin layers of Si-oxide ($SiO_2$) or Si-nitride ($SiN_x$) by either ALD, PECVD or PLCVD with simultaneous co-adsorption of silanes with proper functional groups. By the deposition of the silicon oxide or silicon nitride, functionalized silica gels may be formed, as they are in use for metal scavengers or catalysts. Metal oxides, which may be embedded into the inorganic Si—O— or SiN-network, may act as ion or element catchers. Sn, Zn, Mo, or Zr may act as sulfur catcher, Ca may catch chloride.

In various embodiments, no patterning may be required, because the inorganic materials are non-conductive.

In various embodiments, for the materials and methods above for forming the protective layer (all variants, i.e. conductive and non-conductive, selective and non-selective), also a set of alternative and rather novel approaches may be applied, for example an analogy to ink-jet printing, an analogy to DoD (drop on demand) printing or similar or other approaches from so-called "rapid prototyping" or "rapid manufacturing".

These approaches may be applied for metals, inorganic or organic materials. In e.g. ink-jet printing, small (few nm to μm sized) particles of the respective materials (metals, inorganic or organic) may be provided in a liquid emulsion or suspension. Such drops or bubbles may be sprayed onto defined surfaces, either selectively or area-specific by providing the appropriate coordinates, or non-selectively. The liquid solvent may be evaporated by heating to temperatures up to about 200° C., leaving the deposited or coated material behind on the respective surface. Some organic materials may be applied in a molten (already liquid) state without additional solvent, which may cool down and form to shape at the respective surface.

In various embodiments, the same methods, e.g. the analogy to ink-jet printing or the analogy to DoD printing, may also be used for direct patterning of the protective layer. The printing may be used for supplying specific etchants to pre-defined locations to remove unwanted materials from these locations, leading to a directly patterned structure. The required information on specific locations may be provided by e.g. a bonding diagram in a digital manner.

In various embodiments, for the materials and methods above for forming the electrically non-conductive protective layer, digital light processing for e.g. natural or synthetic resins in liquid state, fused deposition modeling for e.g. plastics or resins, or specific modifications to these approaches may be used.

An advantage of the above described embodiments may be that a corrosive attack of metal surfaces, e.g. of the wire, may be either significantly reduced or completely avoided. Thus, a degradation of e.g. the wire interconnects may be minimized or completely suppressed, and a detrimental impact on an electrical (e.g. wire) interconnect reliability and lifetime may be significantly reduced.

In various embodiments, a wire bond interconnect degradation may be prevented by optimized bond wire and metal surfaces. Bond wires (and/or other metal surfaces) may be used in the chip package in which a core material (e.g. Cu, Ag, etc.) may be partly or completely protected or shielded by a more effective protective layer, e.g. a coating or doping, than noble metals. This may avoid or at least significantly reduce e.g. the catalytic decomposition of sulfur containing compounds and other compounds as described above at metal surfaces, the rapid diffusion of e.g. metal-$S_x$-compounds along the wire or other metal surface, and/or the creep corrosion of reaction compounds, e.g. Cu—$S_x$-compounds.

In various embodiments, a new method for forming a reliable Cu—Cu metal bonding, independent of a Cu barrier stack (i.e. independent of composition, layer thicknesses etc. of a multi-layered Cu barrier stack), may be provided. A risk of reliability loss, due to the Cu bonding process, may be strongly minimized, independent of the barrier structure and Cu thickness.

In various embodiments, after Cu bonding, an additional chemical deposition of Cu, e.g. from a liquid solution (e.g. an electrolyte), e.g. by galvanic deposition, may be executed. The additional deposition process may be followed by a thermal treatment for annihilating the interface of the two metals (i.e., pre- and post-deposited). Using the described sequence of processes, a standard Cu bonding process may be rendered more effective, and the bond may be stabilized and thus have a higher reliability. Furthermore, stress may be released from the copper layer.

Figure 3A:
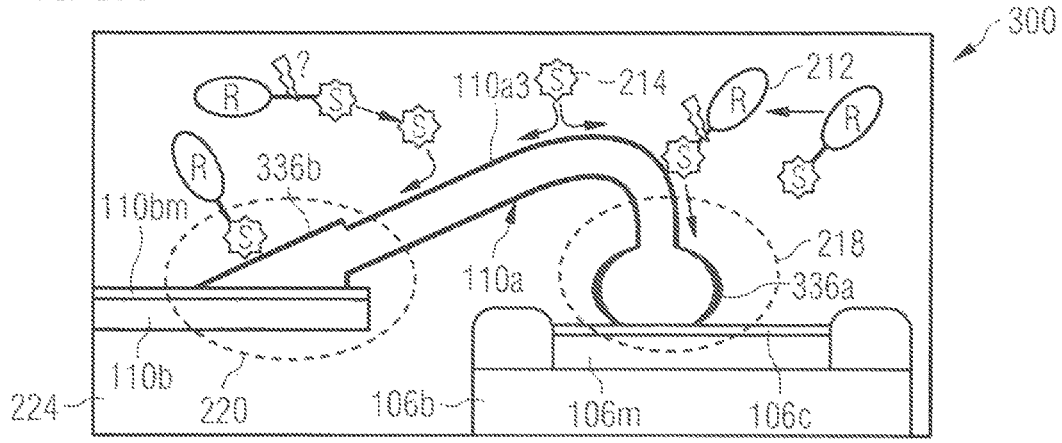
FIG. 3A to FIG. 3C show schematic cross sections of chip packages according to various embodiments.
Figure 3B:
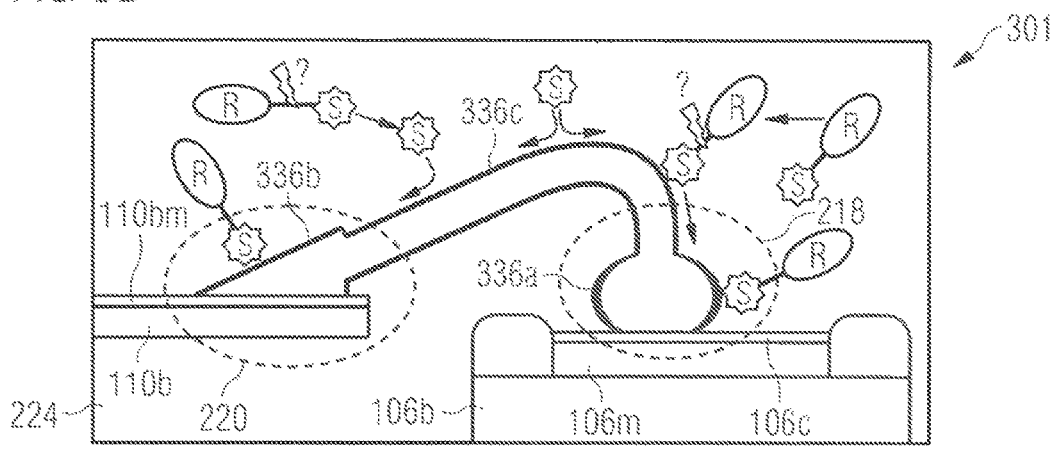
Figure 3C:
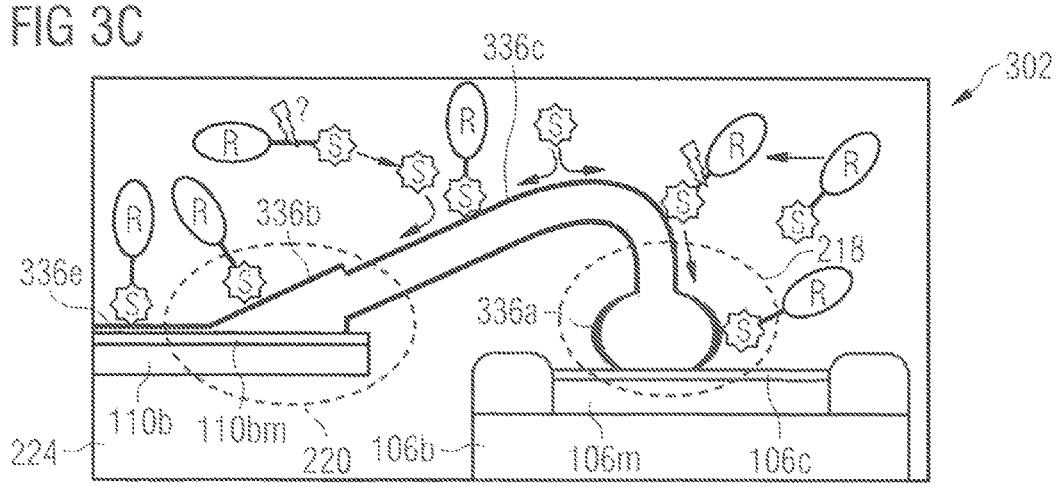

FIG. 3A to FIG. 3C show schematic cross sections 300, 301, and 302 of respective chip packages according to various embodiments.

In various embodiments, a chip package may be provided.

The chip package may generally include similar or identical parts and/or may be formed by similar or identical processes as described in context with FIG. 1A, FIG. 1B and FIG. 2. For such parts, the same reference signs may be used, and a repetitive description may have been omitted.

The chip package may include a chip 106 including a chip metal surface 106m (with or without the cap layer 106c), a metal contact structure 110, the metal contact structure 110 electrically contacting the chip metal surface 106m (or the cap layer 106c, for example in a case of the cap layer 106c being electrically conductive), a packaging material 224, and a protective layer 336a, 336b, 336c, 336d, 336e including or consisting of a portion 336a, 336b, 336c formed at an interface between a portion 110a, 110b of the metal contact structure 110 and the packaging material 224, wherein the protective layer 336a, 336b, 336c, 336d, 336e may include or essentially consist of at least one material of a group of inorganic materials, the group consisting of aluminum oxide, copper oxide, amorphous or crystalline silicon dioxide, tetraethyl orthosilicate, a nitride, a phosphate, a carbide, a boride, an aluminate, amorphous carbon or other carbon-rich material, a compound comprising nitrogen and the metal of the chip metal surface and/or of the metal contact structure, and a compound including silicon and the metal of the chip metal surface 106m and/or of the metal contact structure 110.

In various embodiments, the metal contact structure 110 may include or consist of at least one of, e.g., a wire, a leadframe, a bump, a micro-bump, a pillars, a clip, a spring, a metal filling in e.g. a "through encapsulation" or "through mold compounds" or "through silicon" via, or any other interconnect for 3-dimensional or vertical connection, a metal layers on or in a (e.g. polymer) substrate of the package, a chip top front side metallization, a redistribution layer, and a chip backside metallization.

Metal surfaces that may in various embodiments additionally be present in the chip package (not shown) may include passive components, e.g. inductors, capacitors, or resistors, either on the chip 106 or elsewhere in the package. In various embodiments, between the additional metal surfaces and the packaging material 224, a portion of the protective layer 336 may also be formed.

In various embodiments, not all of the portions 336a, 336b, 336c, 336d, 336e of the protective layer 336 may be formed in the chip package. For example, as shown in FIG. 3A, only the portions 336a and 336b (or only one of them, not shown) may be formed. The portion 336a may be formed at a contact region 218 where the metal contact structure 110 physically and electrically contacts the chip 106, e.g. the chip metal surface 106m. The portion 336b may be formed at a contact region 220 where a first portion 110a, e.g. a wire, of the metal contact structure 110 physically and electrically contacts a second portion 110b, e.g. a leadframe, of the metal contact structure 110. For example, as shown in FIG. 3B, only the portions 336a, 336b and 336c (or only one or two of them, not shown except FIG. 3A) may be formed. The portion 336c may be formed at the first portion 110a, e.g. a wire, of the metal contact structure 110. For example, as shown in FIG. 3C, the portions 336a and/or 336b and/or 336c, and/or portion 336e may be formed, wherein the portion 336e may be formed at an interface region between the second portion 110b of the metal contact structure 110 and the packaging material 224. As shown in FIG. 3C, in addition to the portion 336a and/or the portion 336b, and/or the portion 336c, and/or the portion 336e, the portion 336d may be formed at an interface between the chip metal surface 106m and the packaging material 224.

In various embodiments, a material of the protective layer 336a, 336b, 336c, 336d, 336e (for short, also referred to as the protective layer 336) may not or not only consist of one or more noble metals, which may be known to strongly adsorb and catalytically decompose e.g. sulfur containing compounds and/or which may be known to support the rapid diffusion of e.g. sulfur containing fragments along its surfaces and/or which may be known to allow creep corrosion of reaction products like e.g. $CuS_x$ or $AgS_x$. The layer 336, e.g. the coating or doping material, may include one or more metals that may form stable compounds, e.g. with corrosive elements, e.g. metal-sulfur compounds. Thus, sulfur or other corrosive fragments may be irreversibly bonded and fixed and may not be available for corrosive attack of the metal surface, e.g. the metal of the wire core 110a3.

A wire bond interconnect degradation may thus be prevented in accordance with various embodiments by optimized, e.g. protectively coated or plasma-treated, bond wire 110a and metal surfaces. In various embodiments, the metal contact structure 110, which may for example include or consist of Cu, Ag, etc., may be partly or completely protected or shielded by a more effective layer 336, e.g. coating or doping, than noble metals. This may avoid or at least significantly reduce e.g. the catalytic decomposition of sulfur containing compounds 212 and other compounds as described above at metal surfaces, the rapid diffusion of e.g. metal-$S_x$-compounds along the wire 110a or other metal surface, and/or the creep corrosion of reaction compounds, e.g. Cu—$S_x$-compounds.

In various embodiments, the forming the protective layer 336 may be performed after electrically contacting the chip 106 with the metal contact structure 110, e.g. wire bonding, but before molding, e.g. before arranging, e.g. in physical contact, the packaging material 224 (the molding compound 224) at least partially around the chip 106 and the chip contact structure 110.

In various embodiments, the protective layer 336 may hinder or slow down the corrosive attack. The protective layer 336 may, in accordance with various embodiments, cover either only the unprotected core wire material (portions 336a and 336b in regions 218 and 220, as shown in FIG. 3A), the complete bond wire 110a (portions 336a, 336b and 336c, as shown in FIG. 3B), all electrically conductive surfaces (portions 336a, 336b, 336c, 336d and 336e, as shown in FIG. 3C), or all surfaces in the package (not shown).

In various embodiments, for example in a case of the protective layer 336 including or consisting of one or more electrically conductive (metallic, metalloid or semiconducting) materials, the protective layer 336 may be deposited selectively on electrically conductive surfaces and interfaces of the device, e.g. the chip metal surface 106m and the metal contact structure 110, after performing the connecting, e.g. wire bonding, process. The deposited electrically conductive materials may include or consist of metals, alloys, oxides, phosphates, vanadates, and/or molybdates, for example Al, Ta, Co, Ti, W, Co(P), CoWP, V, Mn, Zr, Mo, Au, Ru, Rh, Zr, Re, Ir, amorphous carbon or other carbon rich material.

In various embodiments, for example in a case of the protective layer 336 including or consisting of one or more electrically conductive (metallic, metalloid or semiconducting) materials, the protective layer 336 may be deposited non-selectively on surfaces and interfaces of the device, e.g. the chip and the metal contact structure, after performing the connecting, e.g. wire bonding, process. The deposited electrically conductive materials may include or consist of metals, alloys, oxides, phosphates, vanadates, and/or molybdates, for example Al, Ta, Co, Ti, W, Co(P), CoWP, V, Mn, Zr, Mo, Au, Ru, Rh, Zr, Re, Ir, amorphous carbon or other carbon rich material. An activation may be performed, for example by heat, laser, radiation, and/or bias. Excessive, non-reacted material of the electrically conductive material, also referred to as overburden, may be removed, e.g. physically or chemically, after the activation.

In various embodiments, the protective layer 336 may include or consist of electrically non-conductive organic material. The protective layer 336 may be deposited selectively on electrically conductive surfaces and interfaces of the device, e.g. the metal contact structure 110, the chip metal surface 106m, etc., or non-selectively on any surface of the device, after performing the connecting, e.g. wire bonding, process. The electrically non-conductive organic material of the protective layer 336 may include or consist of azoles, hydrazines, amines or cyano-compounds.

In various embodiments, the protective layer 336 may include or consist of electrically non-conductive inorganic material. The protective layer 336 may be deposited selectively on electrically conductive surfaces and interfaces of the device, e.g. the metal contact structure 110, the chip metal surface 106m, etc., or non-selectively on any surface of the device, after performing the connecting, e.g. wire bonding, process. The electrically non-conductive organic materials may include or consist of $Al_2O_3$, $AlN_x$, $SiO_2$, $SiN_x$ with or without embedded catchers for certain elements.

In various embodiments, all surfaces of the device may be plasma-treated, e.g. with N-, C- or O-containing plasma after performing the connecting, e.g. wire bonding, process.

In various embodiments, all surfaces of the device may be (pre-)treated with Si-containing species e.g. siloxanes or polysiloxanes.

In various embodiments, materials of choice for forming an electrically conductive protective layer 336 on or in one or more of the metal surfaces in the chip package, for example on or in the metal contact structure 110, e.g. the wire 110a or the portion 110b, or on or in the chip metal surface 106m, may include Pd, Al, Ni, Ta, Co, Ti, W, and/or others. The electrically conductive materials may in various embodiments be deposited as the protective layer 336 by a selective atomic layer deposition (ALD) process, a selective chemical vapor deposition (CVD) process, a selective plasma-enhanced chemical vapor deposition (PECVD) process, or a selective low pressure chemical vapor deposition (LPCVD) process.

Pd, Ni, Ni(P), NiMoP, Co, Co(P), CoWP, Mo, Cr, Au, and/or alloys may in various embodiments be deposited as the protective layer 336 by selective electroless deposition.

Zn, Cr, Au, Pd, Ni, Sn, Mo, Co, V, Mn, Ru, Rh, Zr, Ta, W, Re, Ir, and/or combinations, vanadates and/or molybdates of these materials, including e.g. (commercial) materials, e.g. coatings, like e.g. tin based coatings (like Olin brass supplied by Olin Metal Research Laboratories and modifications to that). may in various embodiments be deposited as the protective layer 336 by selective e-biased deposition (an electrolytic deposition method), e.g. electroplating.

In various embodiments of the protective layer 336 including or consisting of an electrically conductive material, the electrically conductive material may be applied by a non-selective coating, e.g. deposition, of the electrically conductive (metallic, metalloid or semiconducting) materials on surfaces and interfaces of the device, which may be performed after performing the electrical contacting, e.g. wire bonding, process and before providing the molding compound to the package. After a short treatment (e.g. heat, laser, radiation, bias), the protective layer 336 may react with electrically conductive surfaces to form alloys, intermetallics, solid solutions or similar. An overburden (non reacted) material on other surfaces may be removed by physical or chemical treatment.

In various embodiments, materials and processes of choice for forming the electrically conductive protective layer 336 non-selectively on or in one or more of the surfaces in the chip package may include depositing Al at least on the metal (e.g. Cu) surface(s), e.g. the chip metal surface 106m and/or the metal contact structure 110 with unprotected Cu areas. After a temper process, Al may diffuse into Cu to form a CuAl intermetallic compound. Unreacted Al may be etched selectively, and the Cu surface may be protected by the AlCu intermetallic compound.

In various embodiments, materials and processes may be used that may coat all electrically conductive surfaces or coat preferably and/or selectively the material of the unprotected core 110a0 of the bond-wire 110a (e.g. Cu or Ag) and its interfaces.

In various embodiments, the protective layer 336 may include or consist of one or more material(s) that do not form $M-S_x$ compounds or do not undergo $M-S_x$ creep corrosion on noble metals and/or plastics under typical application or stress conditions. For example, ZnS, MoS, SnS, NiS do not show creep corrosion.

In various embodiments, the protective layer 336 may include or consist of one or more material(s) that do not enhance or catalyze the decomposition of e.g. sulfur containing species at its surfaces and which do not enhance or catalyze the formation of metal sulfides, especially not $CuS_x$ or $AgS_x$.

In various embodiments, a thickness of the electrically conductive protective layer 336 may be in a range from about 1 nm to about 200 nm, e.g. from about 20 nm to about 150 nm, e.g. from about 50 nm to about 100 nm.

In various embodiments, processing temperatures during a forming of the electrically conductive protective layer 336 may be in a range from about 180° C. to about 240° C., e.g. from about 200° C. to about 220° C. The temperature range may depend on materials used in the chip package, e.g. a material of a substrate (e.g. the chip substrate 106b and/or a chip carrier 102) and a glue material 104 (for examples of a chip carrier and a glue material, see FIG. 1A).

In various embodiments, a selective coating, e.g. deposition, of electrically non-conductive organic materials on electrically conductive surfaces and interfaces of the device or a non-selective coating, e.g. deposition, on any surface and interface of the device for forming the protective layer 336 may be performed after performing the electrical contacting, e.g. wire bonding, process and before providing the molding compound to the package.

In various embodiments, materials and processes of choice for forming the protective layer 336 of electrically non-conductive organic materials selectively on metal surfaces of the chip package or non-selectively on surfaces of the chip package may include N-containing organic materials like azoles (hetero-aromates with one or more N-atoms), hydrazines, amines or cyano-compounds and derivates thereof, like pyrazole, triazoles (e.g. benzotriazole (BTA), imidazole (IMD)) or oxazoles, tetracyanoquinodimethan (TCNQ) that may be applied to the surface(s) by dipping, spraying or any other suitable physical or chemical process. Compounds of this group may have a high bonding affinity towards certain metal surfaces and are known to form strong complexes with metals, and especially and partially selectively with Cu (e.g. BTA and other azoles, TCNQ).

The materials and processes of choice for forming a protective layer of electrically non-conductive organic materials selectively on metal surfaces of the chip package or non-selectively on surfaces of the chip package may further include imides, polyimides, parylenes (e.g. by CVD coating) or high performance thermoplastics (e.g. coating done by a solution of the polymers) or other paints or finishes, like SU-8 laquers.

The materials and processes of choice for forming a protective layer of electrically non-conductive organic materials selectively on metal surfaces of the chip package or non-selectively on surfaces of the chip package may further include functionalized polymers, like polystyrene or polyethylenglycol with anchor groups both for metals and mold (an anchor group as used herein may refer to a functional group that preferably bonds to metals or mold constituents).

In various embodiments, C—S bondings in functional groups of polymers or oligomers may be more resistant to decomposition than the same functional group in a monomer.

In various embodiments, materials having a high affinity to Cu and/or Ag surfaces and which strongly adhere to them and thus protect from corrosive attack may be used for forming the protective layer. Such materials may for example include electron-rich N-containing organic compounds. The materials having a high affinity to Cu and/or Ag surface may be easy to apply with low-cost processes.

In various embodiments, a thickness of the electrically non-conductive organic protective layer may be in a range from about 1 nm to about 1000 nm, e.g. from about 20 nm to about 700 nm, e.g. from about about 50 to about 500, e.g. from about 100 nm to about 250 nm.

In various embodiments, processing temperatures during a forming of the electrically non-conductive organic protective layer may be in a range from about 180° C. to about 240° C., e.g. from about 200° C. to about 220° C. The temperature range may depend on materials used in the chip package, e.g. a material of the substrate and a glue material.

In various embodiments, a selective coating, e.g. deposition, of the electrically non-conductive inorganic materials on electrically conductive surfaces and interfaces of the device or non-selective coating, e.g. deposition, on any surface and interface of the device for forming the protective layer 336 may be performed after performing the electrical contacting, e.g. wire bonding, process and before providing the molding compound to the package.

In various embodiments, materials and processes of choice for forming the protective layer 336 of electrically non-conductive inorganic materials selectively on metal surfaces of the chip package or non-selectively on surfaces of the chip package may include deposition of thin layers of Al-oxide ($Al_2O_3$) or Al-nitride ($AlN_x$) by either ALD, PECVD or PLCVD (selectively or non-selectively) or by PVD (non-selectively), deposition of thin layers of Si-oxide ($SiO_2$) or Si-nitride ($SiN_x$) by either ALD, PECVD or PLCVD (selectively or non-selectively) or by PVD (non-selectively). ttreatment with liquid chemicals, which may lead to the formation of surface oxides (e.g. $Cu_2O$: from an alkaline Cu-tatrate solution $Cu_2O$ can be deposited on surfaces), which may coat the corresponding metal surfaces with such oxides (e.g. Tetraethylorthosilicat, TEOS), or which may lead to the formation of metal-nitrogen complexes at the surface (e.g. Cu-amino-complexes), amorphous carbon or other carbon rich layers, $SiO_2$ or $Si_3N_4$ layers or any other ceramic layer deposited by e.g. PLCVD, and deposition of thin layers of Si-oxide ($SiO_2$) or Si-nitride ($SiN_x$) by either ALD, PECVD or PLCVD with simultaneous co-adsorption of silanes with proper functional groups. By the deposition of the silicon oxide or silicon nitride, functionalized silica gels may be formed, as they are in use for metal scavengers or catalysts. Metal oxides, which may be embedded into the inorganic Si—O- or SiN-network, may act as ion or element catchers. Sn, Zn, Mo, or Zr may act as sulfur catcher, Ca may catch chloride.

In various embodiments, no patterning of the protective layer 336 may be required, because the inorganic materials are non-conductive.

In various embodiments, a thickness of the electrically non-conductive inorganic protective layer 336 may be in a range from about 2 nm to about 50 nm, e.g. from about 5 nm to about 30 nm, e.g. from about 10 nm to about 20 nm.

In various embodiments, processing temperatures during a forming of the electrically non-conductive inorganic protective layer 336 may be in a range from about 180° C. to about 240° C., e.g. from about 200° C. to about 220° C. The temperature range may depend on materials used in the chip package, e.g. a material of the substrate and a glue material.

In various embodiments, for the materials and methods above for forming the protective layer 336 (all variants, i.e. conductive and non-conductive, selective and non-selective), also a set of alternative and rather novel approaches may be applied, for example an analogy to ink-jet printing, an analogy to DoD (drop on demand) printing or similar or other approaches from so-called "rapid prototyping" or "rapid manufacturing".

These approaches may be applied for metals, inorganic or organic materials. In e.g. ink-jet printing, small (few nm to μm sized) particles of the respective materials (metals, inorganic or organic) may be provided in a liquid emulsion or suspension. Such drops or bubbles may be sprayed onto defined surfaces, either selectively or area-specific by providing the appropriate coordinates, or non-selectively. The liquid solvent may be evaporated by heating to temperatures up to about 200° C., leaving the deposited or coated material behind on the respective surface. Some organic materials may be applied in a molten (already liquid) state without additional solvent, which may cool down and form to shape at the respective surface.

In various embodiments, the same methods, e.g. the analogy to ink-jet printing or the analogy to DoD printing, may also be used for direct patterning of the protective layer 336. The printing may be used for supplying specific etchants to pre-defined locations to remove unwanted materials from these locations, leading to a directly patterned structure. The required information on specific locations may be provided by e.g. a bonding diagram in a digital manner.

In various embodiments, for the materials and methods above for forming the electrically non-conductive protective layer 336, digital light processing for e.g. natural or synthetic resins in liquid state, fused deposition modeling for e.g. plastics or resins, or specific modifications to these approaches may be used.

In various embodiments, a plasma-treatment of all surfaces and interfaces of the device with N-, C- or O- (e.g. $N_2$-, $NH_3$-, $N_2O$) containing plasma may be performed after performing the electrical contacting, e.g. wire bonding, process and immediately before providing the molding compound to the package. Thereby, the protective layer 336 may be formed. As the plasma, a radio frequency (RF-), microwave or remote plasma may be used.

The treating of the surfaces with the N-containing plasma (e.g. $N_2$, $NH_3$, $N_2O$) may form the protective layer 336, e.g. a protective surface coating, e.g. a metal-nitrogen surface coating like $Cu_xN$, $Cu_xNH$, or $Ag_xN$.

The treating of the surfaces with the O-containing plasma (e.g. $O_2$, $O_3$, $N_xO$) may form the protective layer 336, e.g. a protective surface coating, e.g. a metal-oxide or metal-oxygen-nitrogen surface coating like CuO; $Cu_xON$.

In various embodiments, the protective layer(s) 336, e.g. the thin coating(s) created by the plasma treatment, may have a high affinity to Cu and Ag surfaces and may strongly adhere to them and other surfaces and thus protect them from corrosive attack.

A patterning of the protective layer 336 formed by the plasma treatment may not be required, because the protective layer may be non-conductive.

In various embodiments, a thickness of the protective layer 336 formed by the plasma treatment may be in a range from about 1 nm to about 5 nm, e.g. from about 2 nm to about 4 nm, e.g. about 3 nm.

In various embodiments, processing temperatures during the forming of the electrically non-conductive protective layer 336 by plasma treatment may be in a range from about 180° C. to about 240° C., e.g. from about 200° C. to about 220° C. The temperature range may depend on materials used in the chip package, e.g. a material of the substrate and a glue material.

In various embodiments, a treatment of all surfaces with Si-containing species (e.g. SiH$_4$-derivates, siloxanes, polysiloxanes) may be performed to form the protective layer 336, e.g. a protective metal-silicon surface layers like CuSi$_x$ or AgSi$_x$. The treatment may for example be performed shortly before the molding process in a different tool, immediately before the molding process in the molding tool as a pre-coating process or as a first part of the molding process in the molding tool.

An advantage of the above described embodiments may be that a corrosive attack of metal surfaces, e.g. of the wire, may be either significantly reduced or completely avoided. Thus, a degradation of e.g. the wire interconnects (shown in regions 218 and 220) may be minimized or completely suppressed, and a detrimental impact on a wire interconnect reliability and lifetime may be significantly reduced.

Figure 4A:
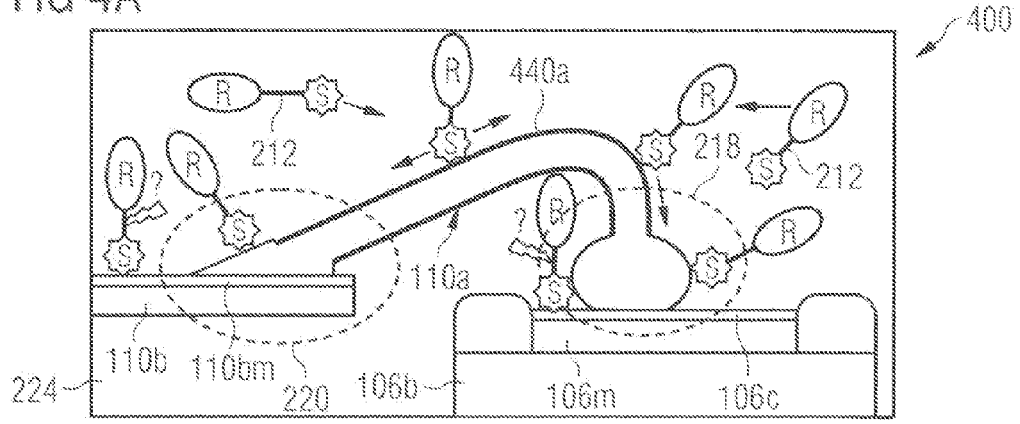
FIG. 4A to FIG. 4C show schematic cross sections of chip packages according to various embodiments.
Figure 4B:
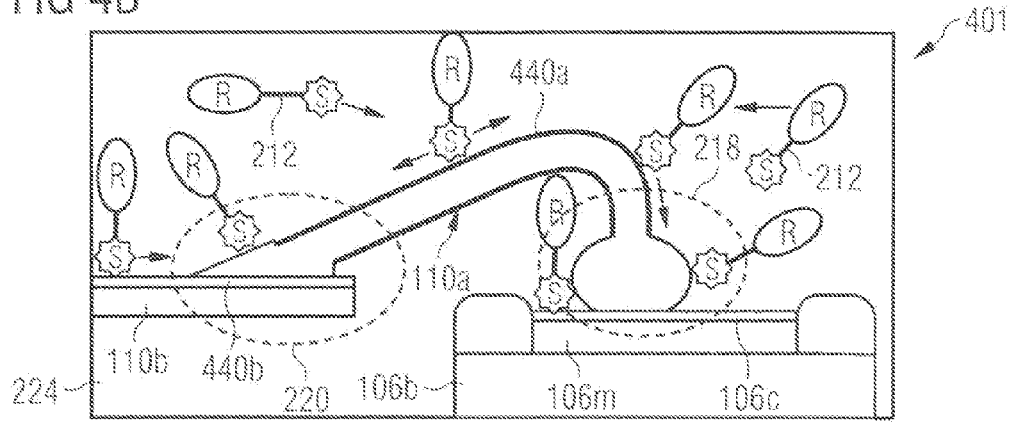
Figure 4C:
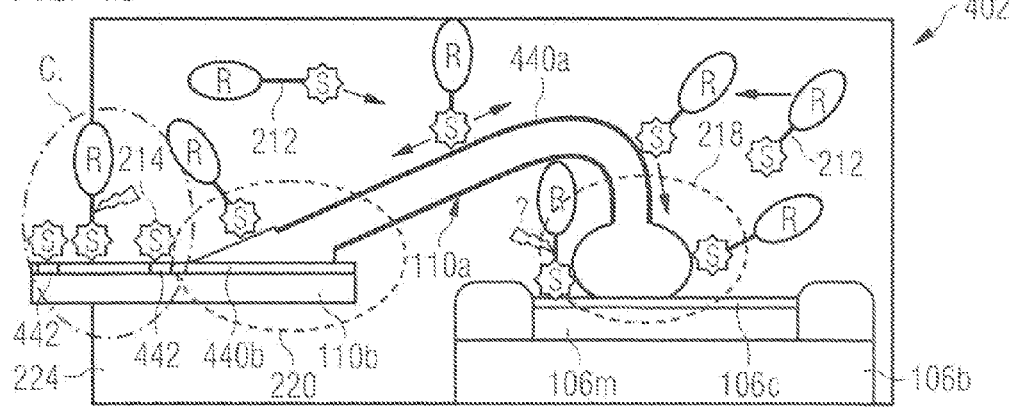

FIG. 4A to FIG. 4C show schematic cross sections 400, 401 and 402 of chip packages according to various embodiments.

In various embodiments, a chip package may be provided.

The chip package may generally include similar or identical parts and/or may be formed by similar or identical processes as described in context with FIG. 1A, FIG. 1B, FIG. 2, and/or FIGS. 3A to 3C. For such parts, the same reference signs may be used, and a repetitive description may have been omitted.

The chip package may include a chip 106 including a chip metal surface 106m (with or without the cap layer 106c), a metal contact structure 110, the metal contact structure 110 electrically contacting the chip metal surface 106m (or the cap layer 106c, for example in a case of the cap layer being electrically conductive), a packaging material 224, and a protective layer, which may have different portions, e.g. the protective layer 440a formed over a first portion 110a of the metal contact structure 110 and/or the protective layer 440b formed over a second portion 110b of the metal contact structure 110. All protective layers 440a, 440b (and/or possibly others) in the package may also be referred to as the protective layer(s) 440.

In various embodiments, metal surfaces formed by the protective layer 440 may be provided in the package that are either not or at least to a lower extent supporting, enhancing or catalyzing the degradation of bond interconnects due to the described corrosion reactions. Such surfaces may include, as a specific bond wire surface, the portion 440a of the protective layer 440, and/or other surfaces of metal components in the package, e.g. of metal components as described above, that may be either doped or coated as the protective layer 440 with specified metals or that may include exposed or embedded islands of such metals.

In various embodiments, as shown in FIG. 4A to FIG. 4C, the protective layers 440 may be formed as a selective coating, e.g. a deposition, of electrically conductive (metallic, metalloid or semiconducting) materials on electrically conductive surfaces and interfaces of the device, e.g. on the metal contact structure 110a, 110b and/or on the chip 106, e.g. the chip metal surface 106m.

The deposited electrically conductive materials, i.e. the protective layer(s) 440, may include or consist of metals, alloys, oxides, phosphates, vanadates, and/or molybdates, for example Al, Ta, Co, Ti, W, Co(P), CoWP, V, Mn, Zr, Mo, Au, Ru, Rh, Zr, Re, Ir, amorphous carbon or other carbon rich material.

In a case of depositing non-selectively, an activation may be performed, for example by heat, laser, radiation, and/or bias. Excessive, non-reacted material of the electrically conductive material, also referred to as overburden, may be removed, e.g. physically or chemically (not shown).

In various embodiments, the materials and processes of choice for forming the electrically conductive protective layer 440 on or in one or more of the metal surfaces in the chip package, for example on or in the metal contact structure 110, e.g. the wire 110a (i.e. forming the protective layer 440a) or the portion 110b (i.e. forming the protective layer 440b), or on or in the chip metal surface 106m (not shown), may include depositing of Pd, Al, Ni, Ta, Co, Ti, W, and/or others by a selective atomic layer deposition (ALD) process, a selective chemical vapor deposition (CVD) process, a selective plasma-enhanced chemical vapor deposition (PECVD) process, or a selective low pressure chemical vapor deposition (LPCVD) process, depositing Pd, Ni, Ni(P), NiMoP, Co, Co(P), CoWP, Mo, Cr, Au, and/or or alloys by selective electroless deposition, and/or despositing Zn, Cr, Au, Pd, Ni, Sn, Mo, Co, V, Mn, Ru, Rh, Zr, Ta, W, Re, and/or Ir by selective e-biased deposition, e.g. electroplating.

In various embodiments, the combinations, alloys, vanadates, and/or molybdates of the materials mentioned above, including the e.g. (commercial) coatings like e.g. tin based coatings (like Olin brass supplied by Olin Metal Research Laboratories and modifications to that), may be deposited by selective e-biased deposition (an electrolytic process), e.g. electroplating.

In various embodiments, materials and processes of choice for forming the electrically conductive protective layer 440 may further include depositing Al non-selectively on or in one or more of the surfaces in the chip package (not shown), for example at least including chip surfaces 106m with unprotected Cu areas. After a temper process, Al may diffuse into Cu to form a CuAl intermetallic compound. Unreacted Al may be etched selectively, and the Cu surface may be protected by the AlCu intermetallic compound as the protective layer 440.

In various embodiments, the protective layer 440 may include or consist of a coating of the core wire material 110a0 (see FIG. 1B) with one or more metals of the group of nickel (Ni), cobalt (Co), chromium (Cr), titanium (Ti), Vanadium (V), manganese (Mn), zirconium (Zr), molybdenum (Mo), tin (Sn) and zinc (Zn), etc., of a coating of the core wire material 110a0 with one or more alloys which are composed of the core wire material (e.g. Cu) and one or more of the metals of the group of nickel (Ni), cobalt (Co), chromium (Cr), titanium (Ti), Vanadium (V), manganese (Mn), tin (Sn), palladium (Pd), gold (Au), zinc (Zn) zirconium (Zr), and molybdenum (Mo), which includes also alloys which are commercially available and in industrial use such as e.g. "monel" (Ni0.66Cu0.33 alloy), which is a trademark of Special Metals Corporation, Huntington (W.V.), USA, of a coating of the core wire material with one or more binary or ternary alloys, intermetallic phases or solid solutions of the group of nickel (Ni), cobalt (Co), chromium (Cr), titanium (Ti), Vanadium (V), manganese (Mn), tin (Sn), palladium (Pd), gold (Au), silver (Ag) zinc (Zn), zirconium (Zr), and molybdenum (Mo), of a coating of the core wire material with a nitride, carbide, boride, or aluminate of the group of nickel (Ni), cobalt (Co), chromium (Cr), titanium (Ti), Vanadium (V), manganese (Mn), tin (Sn), palladium (Pd), gold (Au), zinc (Zn), zirconium (Zr), and molybdenum (Mo), or of a doping of the core wire material (either coated or uncoated) with one or more metals of the group of nickel (Ni), cobalt (Co), chromium (Cr), titanium (Ti), Vanadium (V), manganese (Mn), tin (Sn), palladium (Pd), gold (Au), silver (Ag) zinc (Zn) zirconium (Zr), molybdenum (Mo), and antimony (Sb).

In various embodiments, either only the bond wire 110*a* may be coated or doped with the metals or alloys specified above, thereby forming the protective layer 440*a*, or more or all metal surfaces in the package (e.g. also leadframe surfaces 110*b*) may be coated or doped with one or more of the metals or alloys specified above, thereby forming other protective layers, e.b. 440*b*, etc. Instead of the bond wire 110*a*, a different metal contact structure 110 may be used and provided with the protective layer 440*a* as described above.

In various embodiments, by using bond wires 110*a* (and other metal surfaces) in which the core material 110*a*0 (e.g. Cu, Ag, etc.) may be protected or shielded by the protective layer 440, the following processes may be avoided or at least significantly reduced: a catalytic decomposition of sulfur containing and other compounds at metal surfaces, a rapid diffusion of e.g. metal-$S_x$-compounds along the wire 110*a* or other metal surface, and a creep corrosion of reaction e.g. Cu—$S_x$-compounds.

In various embodiments, the protective layer 440, e.g. the coating or doping, may also be formed on/in other surfaces in the package, e.g. other than the bond wire 110*a* or other than metal surfaces.

In various embodiments, the package may not contain any surface that is either composed by a noble metal (Au, Pd, Pt) or by an alloy or solid solution of these noble metals. For example, the protective layer 440 may be free from noble metals.

In various embodiments, the protective layer 440 may include or consist of a noble metal (Au, Pd, Pt) or an alloy or solid solution of these noble metals. In that case, the protective layer 440 may have a thickness of less than 20 nm, e.g. less than 10 nm.

In various embodiments, one or more of these surfaces (an exemplary embodiment is shown in FIG. 4C, see the protective layer 440*b*) may include embedded or exposed islands 442 of a different metal (for example of a core metal, e.g. of the metal contact structure 110, e.g. of the leadframe 110*b* as described above, e.g. copper or silver, or a deposited non-noble metal). Such islands 442 may act as scavengers for corrosive components. Pattern and density of the embedded or exposed islands 442 may vary in a wide range.

In various embodiments, a thickness of the protective layer 440, e.g. the coating layer, which may include a plurality of individual layers (not shown), may be in the range of 1 nm to about 300 nm, e.g. in a range from 5 nm to about 200 nm, e.g from about 10 nm to about 100 nm, depending on the number of individual layers, e.g individual coating layers, and on the core wire diameter.

In various embodiments, the protective layer 440 may be formed before the bonding process. In that case, it may be understood that during a processing of a first bond (e.g. during FAB formation) and/or during a processing of a second bond (e.g. wedge process) of, e.g., a wire 110*a* having a protective layer 440 as described above, the core material 110*a*0 of the wire (e.g. Cu or Ag) may be exposed at the regions 218, 220 where the interconnects are formed. Accordingly, the core wire material may no longer be protected by e.g. the coating 440*a* at these locations. However, it is pointed out that the coatings and dopings proposed in the above embodiments regarding the protective layer 440 formed on/in the metal contact structure 110, e.g. the wire 110*a*, may not enhance or even catalyze the decomposition of e.g. the sulfur containing components 212, may not allow the easy and rapid diffusion of e.g. sulfur containing components 212 or its fragments 214 along the wire surface, may not support, enhance or even catalyze the reaction of the core wire material with e.g. sulfur containing components 212 or fragments 214, which would lead to the formation of e.g. $CuS_x$ or $AgS_x$, and may not support the rapid and easy creep corrosion of reaction products like e.g. $CuS_x$ or $AgS_x$ along its surface or interfaces to the same extent as pure noble metals (e.g. Pd, Pt, Au) may do.

Forming the protective layer 440 over, e.g. on, the metal contact structure, e.g. the wire 110*a* and/or the leadframe 110*b*, before the electrical contacting of the chip 106, may facilitate a manufacturing of the chip package, because the protective layer 440 may be formed as a process in a production of the metal contact structure 110. However, the protective layer 440 may in various embodiments be formed after performing the electrical contacting, e.g. wire bonding, process and before providing the packaging material 224 to the package.

Thus, in various embodiments using the protective layer 440 in the chip package, the detrimental corrosion attack and degradation of the interconnects may be significantly reduced, and the interconnect reliability may be improved.

In various embodiments, e.g. as shown in FIG. 4A, only the bond wire 110*a* may be coated or doped with the metals or alloys specified above.

In various embodiments, more or all metal surfaces in the package (e.g. also leadframe surfaces 110*b*) may be coated or doped with one or more of the metals or alloys specified above.

In various embodiments, a thickness of a noble metal protective layer 440 at one or more parts of the package may be less than about 20 nm, for example less than about 10 nm. Experiments confirmed that this limitation of noble metal layer coating thickness may provide a solution to the corrosion issue. This may for example in particular be the case if the corresponding surfaces (e.g. leadframe surface 110*b*) are roughened and/or if the core material of the particular package component (e.g. leadframe 110*b*) is composed of e.g. nickel (Ni), cobalt (Co), chromium (Cr), titanium (Ti), Vanadium (V), manganese (Mn), tin (Sn), zinc (Zn), zirconium (Zr), molybdenum (Mo) or other metal that may form stable compounds, e.g. metal-sulfur compounds, but that may however not show creep corrosion but self-passivation and thus may not lead to interconnect degradation.

In various embodiments, the package may include one or more surfaces that may be composed either of a noble metal (Au, Pd, Pt) or of an alloy or a solid solution of noble metals. One or more of these surfaces may have embedded or exposed islands 442 of a different metal, which may include or be composed of e.g. nickel (Ni), cobalt (Co), chromium (Cr), titanium (Ti), Vanadium (V), manganese (Mn), tin (Sn), zinc (Zn) zirconium (Zr), molybdenum (Mo), or other metal that may form stable compounds, e.g. metal-sulfur compounds, that may not show creep corrosion but self-passivation and thus may not lead to interconnect degradation. Sulfur and/or other corrosive fragments 214 may be irreversibly bonded and fixed at these embedded or exposed metal islands 442. Thus, they may not be available for corrosive attack of the core wire material (e.g. Cu, Ag) and thus corrosive degradation of the bond interconnect may be avoided or at least significantly reduced. Pattern and density of the proposed embedded or exposed islands 214 of a different metal can vary in a wide range.

In various embodiments, the embedded or exposed islands 214 may have a size larger than about 1 nm, e.g. larger than about 2 nm, e.g. larger than about 5 nm, e.g. larger than about 10 nm, e.g. larger than about 50 nm, e.g. larger than about 100 nm. Herein, the term size may refer to a diameter of an essentially circular island, or to a length of a largest extent in a case of the island not having an essentially circular shape, but rather ellipsoidal, polygonal, or any other shape. In various embodiments, a total fractional area covered by the plurality of islands 214, e.g. a percentage of area covered by the plurality of islands 214 as compared to a total area of the metal surface, e.g. the lead frame 110b, may be larger than about 5%, e.g. larger than about 10%, e.g. larger than about 20%. In various embodiments, a balance may be obtained between a functionality provided by the surfaces that may be composed either of a noble metal (Au, Pd, Pt) or of an alloy or a solid solution of noble metals (protection from oxidation, which may allow for improved soldering or wire bonding performance or improved adhesion) and a corrosion protection provided by the exposed islands. The larger the exposed islands and/or the larger the fractional surface covered by the exposed islands, the better may be a protection from corrosion. Starting at about 5% of area covered by the exposed islands and/or a minimum size of 1 nm, a protection from corrosion may in various embodiments be provided. A maximum value for an area that may be covered by the exposed islands and/or a maximum size of the islands may in various embodiments depend on various parameters like the metal of the metal surface, the process used for forming an electrically conductive connection (e.g. soldering or wire bonding), a requirement for adhesion (e.g. of the packaging material 224), etc., such that a balancing, and thus an upper limit for a maximum size of the exposed islands and/or of a fractional area covered by the exposed islands may depend on the circumstances.

FIG. 5A shows, as schematic cross sections 500, various stages of two alternative processes of forming an electrical contact according to various embodiments. The two alternative processes have two common stages, a and e, and three stages, (b to d), that are individual to one or the other of the alternative processes. The process shown on the left (including sequential stages a, b1, c1, d1 and e may be referred to as the contact process, and the process shown on the right (including sequential stages a, b2, c2, d2 and e may be referred to as the non-contact process.

In various embodiments, a method of forming an electrical contact may be provided. The electrical contact may be formed between a metal contact structure or a part of it, like the metal contact structure 110a, and a metal surface 106s.

The metal contact structure 110a may in various embodiments include or consist of a wire, for example a copper wire. In various embodiments, the contact structure 110a may be any kind of electrical lead and may include lead geometries differing from a wire, like clips, springs, 3D plates, etc., for which the described embodiments would represent, in the common meaning of the words, an electrochemical jointing process.

In various embodiments, the material of the metal contact structure 110a may be different from (e.g. pure) copper, e.g. include or consist of a different metal, e.g. silver. In other words, Cu may represent here a just specific embodiment. Tables of data may be available in literature from which specific combinations of metal and bath solution may be selected in order to optimize different combination of metal/compound deposition and/or selectively choose a deposition rate of/on different layers (multi-thickness layers).

The metal surface 106s may be a surface of a metal layer 106m including or consisting of copper or a different metal, for example the same metal as the metal contact structure 110a.

In various embodiments, the metal contact structure 110a and/or the chip 106, or a part of the chip 106, for example the metal layer 106m or its surface 106s, or part of them, may be covered uniformly, non-uniformly, or in a structured way by an additional layer (which may be similar or identical to the cap layer 106c above) prior to the process represented by the stages shown in panels c1 and c2 of FIG. 5A. Various embodiments are represented in FIG. 5C b1-1 and b2-1, which may be considered as zoomed-in views of FIG. 5A b1 and b2, respectively, with the additional layer 106c being formed on the metal layer 106m. The stage shown in panel b1-1 of FIG. 5C may be followed by the processes represented by panels c1, d1 and e, and the stage shown in panel b2-1 of FIG. 5C may be followed by the processes represented by panels c2, d2 and e, respectively.

In various embodiments, the metal surface 106s (and the metal layer 106m) may be part of a semiconductor device 106, e.g. of a chip 106, for example of a chip 106 as described above. The chip may, in various embodiments without being limited thereto, include a semiconductor 106b, a structured interlayer oxide 106z (also referred to as ILOX), including contact holes 106h to the semiconductor 106b, a Cu barrier layer (or any kind of fill, protective, or stacked metal or conductive layer) 106mb and a thick Cu (106mt). The chip 106 may, after the electrical contacting, be packaged with packaging material (not shown here). In various embodiments, the metal surface 106s may be part of a different device, for example of a second portion 110b of a metal contact structure, for example a leadframe, or any other metal surface, e.g. as described above, e.g. including copper and/or silver, that may require electrical contacting.

b1 shows a stage after a bonding process, wherein a (e.g. thin) Cu bonding wire 110a may be bonded to the metal surface 106s.

b2 shows the wire 110a as being arranged not completely in touch with the Cu surface 106s of the device 106. Instead, the bonding wire 110a may be arranged with a distance d between a lower edge of the bonding wire 110a and the metal surface 106s.

b3 (see FIG. 5B) shows a stage after a bonding process that may be considered a combination of b1 and b2, with a portion of the bonding wire 110a bonded to the metal surface 106s, and another portion being arranged not completely in touch with the Cu surface 106s of the device 106. The arrangement of b3 may, in various embodiments, be used as an alternative to the arrangements shown in panels b1 and b2, respectively, of FIG. 5A.

c1 and c2 show the arrangements of b1 and b2, respectively, as being subjected to an additional Cu deposition process.

In various embodiments, in c1, a galvanic deposition (applying a current flow in an electrolyte 550 including copper ions) may be used for obtaining an additional deposited layer 106d (in the exemplary embodiment, the additional deposited layer is a copper layer). For the electrochemical (copper) deposition, an electrical path may be required. Such a deposition process may be executed as generally known in the art. The additional layer 106d may be deposited, depending on the specific embodiment, arranged on the metal surface 106s only, on the wire 110a only, on part of them, or on both of them.

In c2, an e-less technique using an electrolyte 552 to which no external current needs to be provided for achieving a deposition of ions, e.g. copper ions, included in the electrolyte 552, may be used for obtaining the additional deposited layer 106d.

An overall reaction for the exemplary electro-less copper deposition shown in FIG. 5 d2 may use formaldehyde (HCHO) as a reducing agent and may be summarized as:

$$Cu^{2+}+2HCHO+4OH^-\rightarrow Cu+2HCOO^-+2H_2O+H_2 \quad (1)$$

Herein, HCOO⁻ (formic acid) may be an oxidation product of the reducing agent.

The chemical equation (1) may be decomposed into a simple reduction reaction and (the cathodic partial reaction "k"), and one oxidation reaction (the anodic partial reaction "a"):

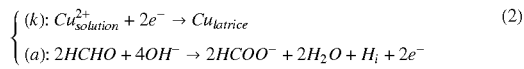
$$\begin{cases} (k): Cu^{2+}_{solution} + 2e^- \rightarrow Cu_{latrice} \\ (a): 2HCHO + 4OH^- \rightarrow 2HCOO^- + 2H_2O + H_i + 2e^- \end{cases} \quad (2)$$

These two partial reactions, however, may occur at one and the same electrode, namely at a metal-solution interphase. Each of these reactions may strive to establish its own equilibrium potential.

As described in M. Paunovic, Plating, 55, 1161 (1986), and schematically shown in FIG. 6, the mechanism of the thin film formation may be characterized by three simultaneous crystal building processes: nucleation (also referred to as formation; see the leftmost view of FIG. 6), growth (see the middle view of FIG. 6), and coalescence of three dimensional crystallites 600 (TDCs; see rightmost view of FIG. 6) in conjunction at their grain boundaries (GBs) 660. Such growth mechanisms may lead to a formation of continuous thin Cu films, up to a thickness of about 3 μm. For a Cu thickness of more than about 2 μm, the overall film growth may follow according to a specific preferential TDC crystal orientation, inhibition of vertical growth of non-favorable crystal orientation, lateral joining of grains (e.g. at the grain boundaries 660), and a growth of new layer grains 662.

In various embodiments, a Cu thickness of more than about 2 to 3 μm (e.g. upt ot 5 μm or more) may be obtained, for example by using a different chemistry, or by including voids in the additional deposited layer 106d, for example because, depending on the purpose, they may not be harmful or even desired.

Figure 6:
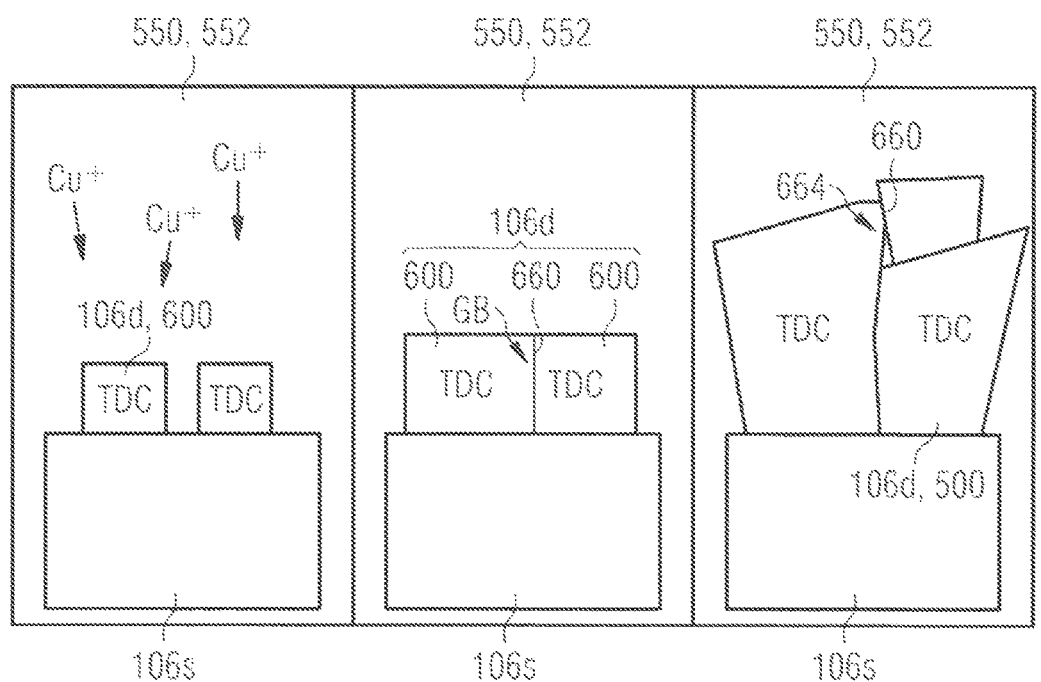
FIG. 6 shows, as schematic cross sections, detailed aspects of a process of forming an electrical contact according to various embodiments.

In FIG. 6 (left), the nucleation of Cu to form three dimensional crystals 600, which may eventually form the deposited layer 106d, is shown. As shown in the middle of FIG. 6, the three dimensional crystals 600 may coalesce and form grain boundaries 660. Finally, in a case of the deposition process going on even further (shown in the right panel of FIG. 6), a formation of voids 664 cannot be avoided due competition of the several involved growing mechanisms.

In order to prevent void 664 formation within the final Cu stack during the process proposed for bonding, as in the process sequence (a, b2, c2, d2, e) or in (a, b3, c2, d2), or in any variation of them, one could set the Cu wires 110a at a distance d from 106s, not larger than 3 μm, e.g. in a range from about 0 μm to about 3 μm, e.g. from about 0.5 μm to about 2 μm, e.g. around 1 μm.

In various embodiments, a module assembly, with the bonding process, should occur before the deposition process. Thus, the whole module may be immerged into the deposition bath 550, 552.

As a consequence, the metal deposition may occur onto the Direct Copper Bonded (DCB) metals, or Printed Circuit Board (PCB) metals, or any contact or support metals too (leads, plate, or on any system part where equation "k" may lead to an ion precipitation). Specific design rules may be used to reduce or enhance a metal deposition from the deposition bath 550, 552, in different regions of the system.

In d1 and d2, the additional deposited layer 106d is shown for each of the embodiments. As an explanatory example, the deposited layer 106d is shown as a uniformly deposited layer both on the metal surface 106s and on the wire 110a, without being limited thereto. The deposition process shown in c1/c2 may be executed sufficiently long for the deposited layer 106d to form as a layer that may cover at least a portion of the metal surface 106s and at the same time enclose at least a portion of the metal contact structure 110a, thereby, in the case of d1, enveloping and strengthening a contact region where the metal contact structure 110a contacts the metal layer 106m, and, in the case of d2, creating a physical and electrical contact between the metal contact structure 110a and the metal layer 106m (in other words, bridging the distance d between the lower edge of the bonding wire 110a and the metal surface 106s), and furthermore enveloping and strengthening the contact region as described for d1. One or more contact regions may be formed (in the exemplary embodiment of FIG. 5A: two contact regions).

In various embodiments, the additional deposited layer 106d may grow on both, the metal contact structure 110a and the metal surface 106s (as shown), or only on the metal surface 106s (as described above), or only on the metal contact structure 110a, or only on regions or either or both of the metal surface 106s and the metal contact structure 110a, respectively (not shown).

As shown in e, an annealing process may be executed subsequent to the depositing process of c1/d1 and c2/d2, respectively. Thereby, the Cu—Cu interface as shown in d1 and d2 may vanish. In other words, after the annealing process, the pre-deposition metal layer 106mt and the deposited metal layer 106d may have joined to form a homogeneous or more strongly connected metal layer 554. In the metal layer 554, the metal contact structure 110a may be/result at least partially embedded, see contact regions 556. Such or additional post-processing conditions, like temperature or environment, may change depending on the specific application field of this invention. For instance the annealing may in various embodiments be executed as a heating process, wherein the device may be heated up to a temperature of below 450° C., for example in a range from about 250° C. to about 420° C., e.g. from about 300° C. to about 400° C.

The low temperature (below 450° C.) process for the annealing, e.g. for eliminating/removing the metal grain boundaries, may be fully compatible with finalized semiconductor devices and with standard passivation layers.

In various embodiments, additional optional processes may be included, for example a cleaning process prior or subsequent to the annealing, or an additional plating process (e.g. a protection layer deposition), or any combination of such additional processes.

In various embodiments, the annealing process, e.g. a low temperature annealing process, during which interstitial hydrogen may be released from the GBs of the Cu layer, where only non-volatile H remains in strong bonding to Cu, may be carried out after deposition of the deposited layer 106d. Thereby, a Cu ductility and resistivity may be recovered.

In various embodiments, final additional processes, e.g. a process as represented in panel f in FIG. 5D that may be executed after the process shown in panel e of FIG. 5A, may be performed, for example a forming of a protection coverage layer 558 in order to protect the formed/strengthened contact and/or the metal surface.

In various embodiments, before the forming of the protection coverage layer 558, cleaning and/or conditioning (e.g. plasma etch) processes may be executed for adjusting surface properties of the deposited Cu layer 106d.

The chemical equation (2) for the cathodic deposition (the non-contact alternative of FIG. 5A) may be generalized also for galvanic Cu deposition (the contact alternative of FIG. 5A), where the two electrons that may be required for an activation of the Cu deposition may be provided by an electrical current.

According to various embodiments, a sufficiently high current may be provided to the cathode, which may be electrically connected (e.g. shorted) to an external bias. Such a bias may be provided through the DCB (or PCB or any contact metal), e.g. a second end of the bond wire 110a (dashed part in FIG. 5A). In this case the Cu bond wire 110a may be at the same potential as the Cu pad, such that both may contemporaneously be covered during the galvanic process.

FIG. 7 shows schematic cross sections of two stages of a method of forming an electrical contact according to various embodiments.

Various parts and processes may be identical or similar to corresponding parts and processes as described in context with FIGS. 5A, 5B, 5C, 5D and FIG. 6. Their description may have been omitted.

During a bonding process (in the sense of an initial arranging/contacting, e.g. as shown in FIG. 5A b1, cracks 772 may be formed in the metal contact layer 106mt under bonding feet or in other locations that may be different from the bonding foot, due to mechanical stress delivered to the metal contact layer 106mt by the bonding process. The cracks 772 may, in various embodiments, be sealed (see FIG. 7, right panel) by the method of forming an electrical contact as described above.

In various embodiments, small cracks, induced during the soft bonding process, could thus either be removed by executing a "filling process", by which the cracks 772 may be essentially completely filled in (not shown), or be closed from a top by executing a "capping process", by which cracks may be sealed off or partially sealed off from ambient (which may for example contain contaminating ions) by a capping layer, depending on a size and an amplitude and amount of the cracks.

In various embodiments, the method of forming an electrical contact may be executed as a "purely-capping" method after any bonding occurred, in a standard manner, to prevent—or to hinder—that already formed cracks enable detrimental ions to penetrate toward the semiconductor, e.g. Si, interface. In this embodiment, a strengthening of the bond may be of secondary relevance.

In various embodiments, detrimental effects of the cracks 772 penetrating through the metal pad 106mt may be alleviated or eliminated The metal barrier design, may try to take into account a presence of small cracks, for example by implementing ion capturing or including layers whose aim is to delay ion diffusion. In various embodiments as described above, an availability of the detrimental ions may be reduced. If, after the bonding process, the method of forming an electrical contact according to various embodiments is applied, the cracks may be closed (sealed) as shown in FIG. 7 (right). The ion diffusion may, as a consequence, be minimized by preventing an intrusion of additional external detrimental elements.

In various embodiments, an advantage of the embodiments described in context with FIG. 5A to FIG. 9 may be that the bonding process (in the sense of an initial arranging/contacting, e.g. as shown in FIG. 5A b1 is not required to provide enough strength to the metal contact surface 106s and/or to the metal contact layer 106m, also referred to as metal pad, which may otherwise induce a formation of cracks 772 in the pad itself that may cause function issues if cracks penetrate deep below the Cu pad. In various embodiments, a soft bonding process may be sufficient to ensure only the metal wire 110a to be close enough, or just-in-contact, to the cathode (the metal surface 106s). No penetration of the bond wire 110a and/or no modification of the metal surface 106s may be needed due to the wire 110a being placed at a distance from the metal surface 106s. The mechanical reliability of a bonding connection that may be obtained during a common bonding penetration process may be obsolete here, due to the growth mechanism that may take place at the same time on the Cu pad (the metal surface 106s of the metal contact layer 106m) and on the Cu wire 110a until one continuous material or compound is obtained.

Each of FIG. 8 shows, as schematic cross sections, various stages of a process of forming an electrical contact according to various embodiments;

Various parts and processes may be identical or similar to corresponding parts and processes as described above. Their description may have been omitted.

In various embodiments, the method of forming an electrical connection may include additional intermediate or subsequent processes to the galvanic bonding process.

In various embodiments, the method of forming an electrical connection may additionally include an intermediate deposition process, thereby forming a structured layer 882. The intermediate deposition process may for example include a lithographic process or be a screen-, stencil- or microcontact-printing process, for example as described in B. Micel et al., IBM J. RES & DEV, 45, 5 (2001). Thereby, the metal surface 106s could be additionally prepared/pretreated for the subsequent galvanic bonding process. Further additional intermediate processes may in various embodiments also be included, like thermal treatment or cleaning processes or an inclusion of a thin layer. As an example of the intermediate deposition process, a stencil-printing, which is well established and widely used for assembly of ICs-like SMDs, or single DIEs-, as pre-process before galvanic deposition, may be performed. Herein, a stainless steel stencil 880 may be used to transfer, on top of the metal layer 106mt (the device metal pad), a pattern using metal paste/emulsion 882 containing material like SnAgCu <SAC> alloy, Sn, Zn, In, Mn, etc, as shown in the a-b-c-d sequence of FIG. 8A. The metal paste/emulsion 882 may be squeezed into openings of the stencil using a squeegee 886. Subsequently, the stencil may be removed, leaving the structured metal paste/emulsion 882 on the metal surface 106s.

A thin layer 884 may in various embodiments be formed by a deposition process, like for example ALD, PVD or other methods to obtain a thin layer thickness of up to about 20 nm, e.g. about 10 nm. The thin layer may for example include oxygen or nitrogen or other protective or adhesion promoting materials. The thin layer deposition process may for example be executed prior to the process of forming the structured layer 882, as shown in FIG. 8B. In various embodiments, the thin layer deposition process may be executed subsequently to the processes shown in FIG. 8A and FIG. 8B (not shown).

In various embodiments, depending on a chemical composition, a rheology, and on a patterned geometry of the printed pad, different results may be obtained. For example, a further differentiation of the deposition rate in different areas of the system may be achieved, a bond wire displacement efficiency may be improved, a risk of cracks may be mitigated, a risk of solution encapsulation into voids may be mitigated, etc.

Figure 9:
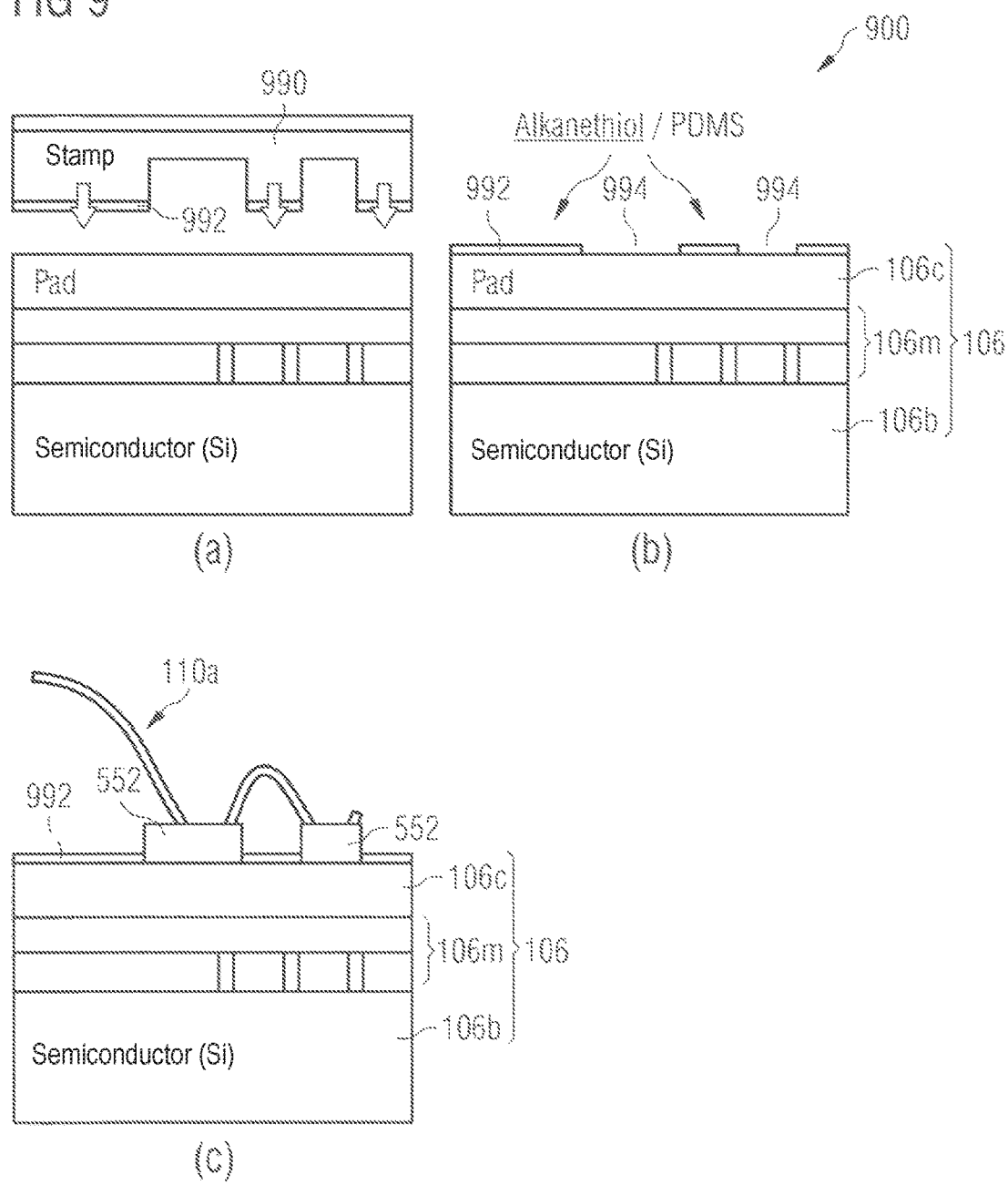
FIG. 9 shows, as schematic cross sections, various stages of a process of forming an electrical contact according to various embodiments.

FIG. 9 shows, as schematic cross sections, various stages of a process of forming an electrical contact according to various embodiments.

Various parts and processes may be identical or similar to corresponding parts and processes as described above. Their description may have been omitted.

In various embodiments, microcontact lithography may for example be used as an example to prevent local metal deposition. As another example, a lithographic technique, like for instance the micro-contact lithography, by means of which one can deposit mask layers 992 onto pad surface 106*s*, with a large throughput, may be used. During a microlithography process, a mask layer 992, e.g. a polymeric monolayer, may be formed, e.g. stamped using a structured stamp 990, on top of the metal contact layer 106*m* (the metal pad). The polymeric monolayer may be able to prevent growth of additional metal in a subsequent electrochemical deposition process, and allow the growth of additional metal (the deposited metal layer 106*d*) only in regions 994 that are uncovered by the mask layer 992. This approach is schematically illustrated in the a-b-c sequence of FIG. 9 and may be viewed as representing a complementary approach of the screen/stencil-printing approach described above. Both of these processes may represent pre-conditioning processes, i.e. done prior to the electrochemical bonding.

In various embodiments, in a post process, a soldering paste may be deposited locally onto the electrochemically bonded contact/interface (not shown).

In various embodiments, as a post process, a protective layer may be deposited, for example as described above.

In various embodiments, intermediated processes, e.g. cleaning, a plasma adhesion promoter process or thermal conditioning, may optionally be executed at any suitable point in the sequence of processes described above.

Figure 10:
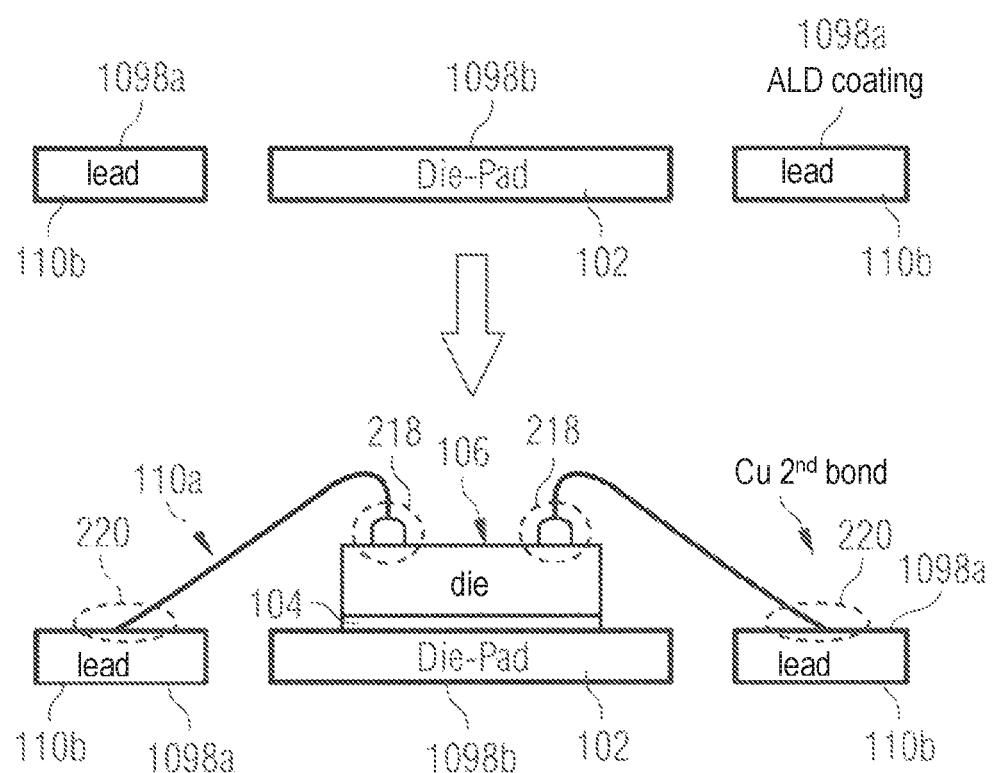
FIG. 10 shows schematic drawings of two stages of a method of forming an electrical contact according to various embodiments.

FIG. 10 shows schematic drawings of two stages of a method of forming an electrical contact according to various embodiments.

In various embodiments, a method of forming an electrical contact may be provided. The electrical contact may be formed between a metal contact structure 110*a* and a metal surface 110*bs*. The metal contact structure 110*a* may be electrically connected to a chip 106, also referred to as a die.

In various embodiments, the metal contact structure 110*a* may include or consist of a bonding wire, for example a copper bonding wire. The metal contact structure 110*a* may, instead of a wire, be formed as any other suitable contacting means as described above for the first portions 110*a* of the metal contact structures 110.

In various embodiments, the metal surface 110*bs* may be a surface of a metal element 110*b*. The metal element 110*b* may correspond to the second portion 110*b* of the metal contact structures 110 described above, for example to a leadframe, for example a leadframe consisting of or including copper. The metal element 110*b* may, instead of a leadframe, be formed as any other metal structure to which the metal contact structure 110*a* may be electrically contacted and which may include or consist of copper.

In various embodiments, the method of forming an electrical contact may include depositing, by atomic layer deposition, a passivation layer 1098*a* over at least a region of the metal surface 110*bs*, wherein the passivation layer may include aluminum oxide. The ALD process may be very conformal and independent of a geometry of the metal surface 110*bs*, e.g. of a leadframe geometry. A thickness of the passivation layer 1098*a* may be essentially uniform.

The passivation layer 1098*a* may protect the copper of the metal surface 110*bs* against oxidation, for example during storage and particularly during assembly, which may be performed at elevated temperatures (e.g. the bonding process may require temperatures of above 200° C.) that may otherwise lead to an oxidation of the copper. Using an appropriate layer thickness, for example a thickness in a range from about 1 nm to about 100 nm, e.g. from about 5 nm to about 50 nm, e.g. from about 5 nm to about 20 nm, e.g. from about 5 nm to about 10 nm, the metal surface 110*bs*, e.g. the leadframe surface, may be protected and wirebonding may still be enabled.

In various embodiments, the method of forming an electrical contact may further include electrically contacting the region of the metal surface 110*bs* with the metal contact structure 110*a*, wherein the metal contact structure 110*a* may include copper.

In various embodiments, before applying the ALD process, an impact of antitarnish coatings may need to be considered, and the metal surface 110*bs* may need to be cleaned properly, as may be known in the art.

Figure 11:
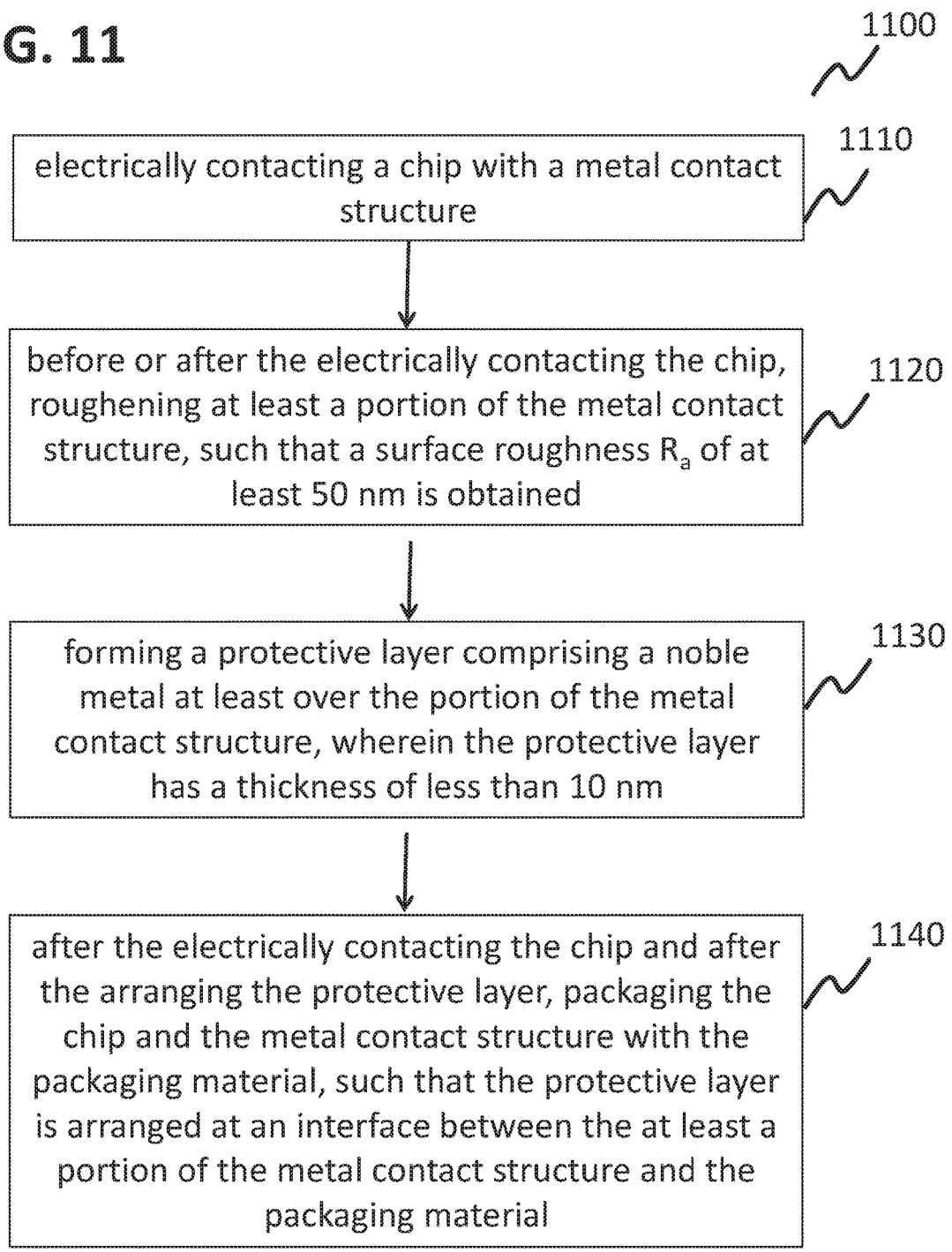
FIG. 11 shows a process flow for a method of forming a chip package according to various embodiments.

FIG. 11 shows a process flow 1100 for a method of forming a chip package according to various embodiments.

In various embodiments, the method of forming a chip package may include electrically contacting a chip with a metal contact structure (in 1110), before or after the electrically contacting the chip, roughening at least a portion of the metal contact structure, such that a surface roughness $R_a$ of at least 50 nm is obtained (in 1120), forming a protective layer including a noble metal at least over the portion of the metal contact structure, wherein the protective layer has a thickness of less than 10 nm (in 1130), and, after the electrically contacting the chip and after the arranging the protective layer, packaging the chip and the metal contact structure with the packaging material, such that the protective layer is arranged at an interface between the at least a portion of the metal contact structure and the packaging material (in 1140).

In various embodiments, the surface roughness $R_a$ may be at least 100 nm, e.g. at least 200 nm, e.g. at least 500 nm, e.g. at least 1 µm.

The surface roughness $R_a$ may refer to an arithmetic average of absolute values of vertical deviations of a surface roughness profile from a mean line of the vertical deviations.

FIG. 12 shows a process flow 1200 for a method of forming a chip package according to various embodiments.

In various embodiments, the method of forming a chip package may include electrically contacting a chip with a metal contact structure (in 1210), forming a protective layer comprising a noble metal at least over a portion of the metal contact structure (in 1220), partially removing the protective layer over the metal contact structure, thereby forming a plurality of regions free from the noble metal, wherein the regions free from the noble metal provide an interface between the packaging material and a non-noble metal of the metal contact structure (in 1230), and, after the electrically contacting the chip and after the arranging and partially removing the protective layer, packaging the chip and the metal contact structure with the packaging material, such that the protective layer is arranged at an interface between the at least a portion of the metal contact structure and the packaging material (in 1240).

FIG. 13 shows a process flow 1300 for a method of forming a chip package according to various embodiments.

In various embodiments, the method of forming a chip package may include electrically contacting a chip with a metal contact structure (in 1310), treating the metal contact structure and the chip metal surface with a plasma, thereby forming a protective layer on or in at least a portion of the metal contact structure and/or the chip metal surface (in 1320), and, after the electrically contacting the chip and after the arranging the protective layer, packaging the chip and the metal contact structure with the packaging material, such that the protective layer is arranged at an interface between the at least a portion of the metal contact structure and the packaging material (in 1330).

FIG. 14 shows a process flow 1400 for a method of forming an electrical contact according to various embodiments.

In various embodiments, the method of forming a chip package may include arranging a metal contact structure over or on a metal surface (in 1410), and plating a metal layer on the metal surface and on the metal contact structure, thereby fixing the metal contact structure to the metal surface and forming an electrical contact between the metal contact structure and the metal surface or strengthening an existing electrical contact between the metal contact structure and the metal surface (in 1420).

FIG. 15 shows a process flow 1500 for a method of forming an electrical contact according to various embodiments.

In various embodiments, the method of forming a chip package may include depositing, by atomic layer deposition, a passivation layer over at least a region of a first portion of a metal contact structure, wherein the passivation layer may include aluminum oxide, and a surface of the region of the first portion of the metal contact structure may include copper (in 1510), and electrically contacting the region of the first portion of the metal contact structure with a second portion of the metal contact structure, wherein the second portion of the metal contact structure may include copper (in 1520).

In various embodiments, a chip package is provided. The chip package may include a chip including a chip metal surface, a metal contact structure, the metal contact structure electrically contacting the chip metal surface, a packaging material, and a protective layer including or consisting of a portion formed at an interface between a portion of the metal contact structure and the packaging material, wherein the protective layer may include or essentially consist of at least one material of a group of inorganic materials, the group consisting of aluminum oxide, copper oxide, amorphous or crystalline silicon dioxide, tetraethyl orthosilicate, a nitride, a phosphate, a carbide, a boride, an aluminate, amorphous carbon or other carbon-rich material, a compound comprising nitrogen and the metal of the chip metal surface and/or of the metal contact structure, and a compound including silicon and the metal of the chip metal surface and/or of the metal contact structure.

In various embodiments, a chip package is provided. The chip package may include a chip including a chip metal surface, a metal contact structure, the metal contact structure electrically contacting the chip metal surface, wherein the metal contact structure includes copper and/or silver, a packaging material, and a protective layer including or consisting of a portion formed at an interface between a portion of the metal contact structure and the packaging material, wherein the protective layer may include or essentially consist of a polymer that is different from the packaging material.

In various embodiments, a chip package is provided. The chip package may include a chip including a chip metal surface, a metal contact structure, the metal contact structure electrically contacting the chip metal surface, a packaging material, and a protective layer including or essentially consisting of a portion formed at an interface between a portion of the metal contact structure and the packaging material, wherein the protective layer may include or essentially consist of at least one metal of a group of metals, the group consisting of Al, Ta, Co, Ti, W, Co(P), CoWP, V, Mn, Zr, Mo, Au, Ru, Rh, Zr, Re, and Ir.

In various embodiments, a chip package is provided. The chip package may include a chip including a chip metal surface, a metal contact structure, the metal contact structure electrically contacting the chip metal surface, a packaging material, and a protective layer including or essentially consisting of a portion formed at an interface between a portion of the metal contact structure and the packaging material, wherein the protective layer may include a noble metal having a thickness of less than 10 nm.

In various embodiments, the portion of the metal contact structure may have a surface roughness of at least 50 nm.

In various embodiments, a chip package is provided. The chip package may include a chip, a metal contact structure including a non-noble metal and electrically contacting the chip, a packaging material, and a protective layer including or essentially consisting of a portion formed at an interface between a portion of the metal contact structure and the packaging material, wherein the protective layer may include a noble metal, wherein the portion of the protective layer may include a plurality of regions free from the noble metal, and wherein the regions free from the noble metal may provide an interface between the packaging material and a non-noble metal.

In various embodiments, the non-noble metal may be the metal of the metal contact structure.

In various embodiments, the non-noble metal may be deposited in the regions free from the noble metal.

In various embodiments, each region of the plurality of regions free from the noble metal may have a minimum diameter of 1 nm.

In various embodiments, a cumulative area of the regions free from the noble metal may be at least 5% of the area of the portion of the protective layer.

In various embodiments, a method of forming a chip package is provided, the chip package including a chip, a metal contact structure and packaging material. The method may include electrically contacting the chip with the metal contact structure, before or after the electrically contacting the chip, roughening at least a portion of the metal contact structure such that a surface roughness of at least 50 nm is obtained, forming a protective layer comprising a noble metal at least over the portion of the metal contact structure, wherein the protective layer has a thickness of less than 10 nm, and after the electrically contacting the chip and after the arranging the protective layer, packaging the chip and the metal contact structure with the packaging material, such that the protective layer may be arranged at an interface between the at least a portion of the metal contact structure and the packaging material.

In various embodiments, a method of forming a chip package is provided, the chip package including a chip, a metal contact structure and packaging material. The method may include electrically contacting the chip with the metal contact structure, forming a protective layer including a noble metal at least over a portion of the metal contact structure, partially removing the protective layer over the metal contact structure, thereby forming a plurality of regions free from the noble metal, wherein the regions free from the noble metal may provide an interface between the packaging material and a non-noble metal of the metal contact structure, and after the electrically contacting the chip and after the arranging and partially removing the protective layer, packaging the chip and the metal contact structure with the packaging material, such that the protective layer may be arranged at an interface between the at least a portion of the metal contact structure and the packaging material.

In various embodiments, a method of forming a chip package is provided, the chip package including a chip, a metal contact structure, and packaging material. The method may include forming a protective layer comprising a noble metal at least over a portion of the metal contact structure, partially removing the protective layer over the metal contact structure, thereby forming a plurality of regions free from the noble metal, electrically contacting the chip with the metal contact structure, and after the electrically contacting the chip and after the arranging and partially removing the protective layer, packaging the chip and the metal contact structure with the packaging material, thereby physically contacting the regions free from the noble metal with the packaging material, wherein, in the regions free from the noble metal, a non-noble metal may be exposed.

In various embodiments, the exposed non-noble metal may be the non-noble metal of the metal contact structure.

In various embodiments, the method may further include depositing a non-noble metal in the regions free from the noble metal. The exposed non-noble metal may be the deposited non-noble metal.

In various embodiments, the electrically contacting the chip may be executed after the arranging and partially removing the protective layer.

In various embodiments, a method of forming a chip package is provided, the chip package including a chip, a metal contact structure, and packaging material. The method may include electrically contacting the chip metal surface with the metal contact structure, treating the metal contact structure and the chip metal surface with a plasma, thereby forming a protective layer on or in at least a portion of the metal contact structure and/or the chip metal surface, and after the electrically contacting the chip and after the arranging the protective layer, packaging the chip and the metal contact structure with the packaging material, such that the protective layer may be arranged at an interface between the at least a portion of the metal contact structure and the packaging material.

In various embodiments, the plasma may include or consist of a plasma of a group of plasmas, the group consisting of $N_2$, $NH_3$, $N_2O$, $O_2$, $O_3$ and NxO.

In various embodiments, a method of forming an electrical contact is provided The method may include arranging a metal contact structure over or on a metal surface, plating a metal layer on the metal surface and on the metal contact structure, thereby fixing the metal contact structure to the metal surface and forming an electrical contact between the metal contact structure and the metal surface or strengthening or thickening an existing electrical contact between the metal contact structure and the metal surface.

In various embodiments, the method may further include, before the plating the metal layer structure on the metal surface and on the metal contact structure, treating the metal surface and the metal contact structure by a process involving wet chemistry, dry chemistry, and/or a plasma in order to prepare a surface of the metal surface and of the metal contact structure for the plating.

In various embodiments, the method may further include, before the arranging a metal contact structure, arranging an intermediate layer on the metal surface.

In various embodiments, the method may further include, before the arranging a metal contact structure, arranging a structured intermediate layer on the metal surface.

In various embodiments, the method may further include, after the arranging a metal contact structure, arranging a final protection layer on the metal surface and on the contact structure.

In various embodiments, the structured intermediate layer may include an adhesion promoter, and the arranging a metal contact structure may include arranging the metal contact structure on or in or partially in the adhesion promoter.

In various embodiments, the arranging the intermediate layer may include deposition, e.g. ALD, stencil printing, or screen printing.

In various embodiments, the intermediate layer may be configured to prevent a plating of the metal on the intermediate layer.

In various embodiments, the method may further include, after the plating of the metal layer, arranging solder over a contact portion where the electrical contact between the metal contact structure and the metal surface may be formed.

In various embodiments, the metal surface may be a chip metal surface, a printed circuit board, or a direct copper bond.

In various embodiments, the metal contact structure may be a contact structure of a package connection level providing an electrical contact between a first package and a second package.

In various embodiments, a method of forming an electrical contact is provided. The method may include depositing, by atomic layer deposition, a passivation layer over at least a region of a metal surface, wherein the passivation layer may include aluminum oxide, and the region of the metal surface may include copper, and electrically contacting the region of the metal surface with a metal contact structure, wherein the metal contact structure may include copper.

In various embodiments, the metal contact structure may be a wire.

In various embodiments, the metal surface may be a surface of a leadframe.

In various embodiments, the electrically contacting the metal surface with a metal contact structure may include a bonding process.

In various embodiments, the bonding process may be a wedge bonding process.

In various embodiments, a method of forming a chip package is provided. The method may include the method of forming an electrical contact.

In various embodiments, the method of forming a chip package may further include electrically contacting a chip with the second portion of the metal contact structure.

In various embodiments, the method may further include at least partially encapsulating the chip and the metal contact structure with a packaging material.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A chip package, comprising:
a chip comprising a chip metal surface;
a metal contact structure, the metal contact structure electrically contacting the chip metal surface;
a packaging material; and
a protective layer comprising a portion formed at an interface between a portion of the metal contact structure and the packaging material;
wherein the protective layer comprises at least one material of a group of inorganic materials, the group consisting of
Ni, Co, Cr, Ti, V, Mn, Zn, Sn, Mo, and Zr,
wherein the protective layer further comprises a noble metal, wherein the protective layer comprises regions free from the noble metal, wherein the regions free from the noble metal provide at least a portion of the interface between the portion of the metal contact structure and the packaging material.

2. A chip package, comprising:
a chip comprising a chip metal surface;
a metal contact structure, the metal contact structure electrically contacting the chip metal surface, wherein the metal contact structure comprises copper and/or silver;
a packaging material; and
a protective layer comprising a portion formed at an interface between a portion of the metal contact structure and the packaging material;
wherein the protective layer comprises a tetracyanoquinodimethane that is different from the packaging material.

3. A leadframe based chip package, comprising:
a chip;
a metal contact structure comprising a non-noble metal and electrically contacting the chip;
a packaging material; and
a protective layer comprising a portion formed at an interface between a portion of the metal contact structure and the packaging material;
wherein the protective layer comprises a noble metal;
wherein the portion of the protective layer comprises a plurality of regions free from the noble metal, and
wherein the regions free from the noble metal provide an interface between the packaging material and the non-noble metal or a further non-noble metal.

4. The chip package of claim 3,
wherein each region of the plurality of regions free from the noble metal has a minimum diameter of 1 nm.

5. The chip package of claim 3,
wherein a cumulative area of the regions free from the noble metal is at least 5% of the area of the portion of the protective layer.

6. The chip package of claim 3,
wherein the non-noble metal comprises the metal of the metal contact structure.

7. The chip package of claim 2, wherein the protective layer further comprises at least one compound selected from the group consisting of azoles, hydrazines, and any combination thereof.

* * * * *